(12) United States Patent
Yamane et al.

(10) Patent No.: US 12,469,761 B2
(45) Date of Patent: Nov. 11, 2025

(54) POWER MODULE INCLUDING HIGHLY-HEAT-DISSIPATING INSULATION ADHESIVE SHEET

(71) Applicant: Mitsubishi Electric Corporation, Tokyo (JP)

(72) Inventors: Tomohisa Yamane, Tokyo (JP); Kei Yamamoto, Tokyo (JP); Kozo Harada, Tokyo (JP); Masaki Taya, Tokyo (JP); Yo Tanaka, Tokyo (JP); Kazuhiro Tada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 619 days.

(21) Appl. No.: 17/707,171

(22) Filed: Mar. 29, 2022

(65) Prior Publication Data

US 2023/0105637 A1   Apr. 6, 2023

(30) Foreign Application Priority Data

Oct. 4, 2021   (JP) ................................. 2021-163244

(51) Int. Cl.
*H01L 23/36* (2006.01)
*H01L 21/48* (2006.01)
(Continued)

(52) U.S. Cl.
CPC ...... *H01L 23/3672* (2013.01); *H01L 21/4871* (2013.01); *H01L 21/565* (2013.01); *H01L 23/3107* (2013.01)

(58) Field of Classification Search
CPC ............. H01L 23/3672; H01L 23/3107; H01L 23/3733; H01L 23/3737; H01L 23/49555;
(Continued)

(56) References Cited

U.S. PATENT DOCUMENTS 5,065,280 A * 11/1991 Karnezos ............ H01L 23/4006
361/705
11,393,733 B2 * 7/2022 Kaneda ............... H01L 23/3735
(Continued)

FOREIGN PATENT DOCUMENTS

CN    113140528 A  *  7/2021  ......... C08G 18/0819
DE   10058446 A1  *  5/2001  ........... H01L 23/051
(Continued)

OTHER PUBLICATIONS

Japanese Office Action dated Jan. 31, 2023 in Japanese Application No. 2021-163244.
(Continued)

*Primary Examiner* — Ida M Soward
(74) *Attorney, Agent, or Firm* — Sughrue Mion, PLLC

(57) ABSTRACT

The power module includes: a heat spreader having a plate shape and having heat conducting property; a semiconductor element at least thermally connected to a one-side surface of the heat spreader; a highly-heat-dissipating insulation adhesive sheet having a plate shape and having a one-side surface thermally connected to an other-side surface of the heat spreader; a metal plate having a one-side surface thermally connected to an other-side surface of the highly-heat-dissipating insulation adhesive sheet; and a sealing resin member sealing the semiconductor element, the heat spreader, the highly-heat-dissipating insulation adhesive sheet, and the metal plate in a state where an other-side surface of the metal plate is exposed, wherein the highly-heat-dissipating insulation adhesive sheet is a complex obtained by impregnating, with a resin, a porous ceramic sintered body in which ceramic particles have a gap and have been integrally sintered.

10 Claims, 16 Drawing Sheets

(51) Int. Cl.
    *H01L 21/56* (2006.01)
    *H01L 23/31* (2006.01)
    *H01L 23/367* (2006.01)
(58) Field of Classification Search
    CPC ......... H01L 23/49562; H01L 23/49575; H01L 23/36; H01L 23/3731; H01L 23/3735; H01L 23/4334; F28F 3/02
    See application file for complete search history.

(56) References Cited

U.S. PATENT DOCUMENTS

| | | | |
|---|---|---|---|
| 2004/0089928 A1 | 5/2004 | Nakajima et al. | |
| 2007/0216013 A1* | 9/2007 | Funakoshi | H01L 24/40 257/691 |
| 2009/0302444 A1* | 12/2009 | Ueda | H01L 25/117 438/109 |
| 2010/0134979 A1* | 6/2010 | Obiraki | H01L 23/3735 361/822 |
| 2011/0037166 A1* | 2/2011 | Ikeda | H01L 24/73 257/E23.101 |
| 2011/0309375 A1* | 12/2011 | Kato | H01L 24/40 257/77 |
| 2013/0267064 A1 | 10/2013 | Ikeda et al. | |
| 2014/0332951 A1* | 11/2014 | Nakamura | H01L 23/3142 257/712 |
| 2016/0064308 A1* | 3/2016 | Yamada | H01L 25/04 257/697 |
| 2018/0033761 A1* | 2/2018 | Watanabe | B23K 35/025 |
| 2018/0277506 A1* | 9/2018 | Watanabe | B23K 35/262 |
| 2019/0027421 A1* | 1/2019 | Nishikawa | H01L 23/49827 |
| 2019/0103340 A1 | 4/2019 | Tsuchimochi | |
| 2020/0132392 A1* | 4/2020 | Joshi | H05K 7/2039 |
| 2020/0176348 A1* | 6/2020 | Lim | H01L 23/49562 |
| 2021/0032171 A1 | 2/2021 | Minakata et al. | |
| 2022/0230943 A1 | 7/2022 | Tani | |

FOREIGN PATENT DOCUMENTS

| | | | | |
|---|---|---|---|---|
| JP | H0613501 A | * | 1/1994 | |
| JP | 2002-110893 A | | 4/2002 | |
| JP | 2003-17627 A | | 1/2003 | |
| JP | 2004-165281 A | | 6/2004 | |
| JP | 2009254106 A | * | 10/2009 | ............... H02J 9/00 |
| JP | 2011258814 A | * | 12/2011 | ............ H01L 23/34 |
| JP | 2012222022 A | * | 11/2012 | ............ H01L 23/36 |
| JP | 2012222327 A | * | 11/2012 | ............ H01L 24/40 |
| JP | 2014-60410 A | | 4/2014 | |
| JP | 2014-183058 A | | 9/2014 | |
| JP | 2015041716 A | * | 3/2015 | ............ H01L 24/33 |
| JP | 2019-67949 A | | 4/2019 | |
| JP | 6877600 B1 | | 5/2021 | |
| JP | 2011-111765 A | | 8/2021 | |
| JP | 2021-111765 A | | 8/2021 | |
| WO | WO-2009125779 A1 | * | 10/2009 | ......... H01L 23/3735 |
| WO | WO-2016121159 A1 | * | 8/2016 | ......... H01L 21/4882 |
| WO | 2019/111978 A1 | | 6/2019 | |
| WO | WO-2021001924 A1 | * | 1/2021 | ........... H01L 21/565 |

OTHER PUBLICATIONS

Japanese Office Action issued Apr. 2, 2024 in Application No. 2021-163244.
Office Action issued Nov. 8, 2022 in Japanese Application No. 2021-163244.
Japanese Office Action issued Aug. 23, 2023 in Application No. 2021-163244.
Decision of Refusal dated May 9, 2023 from the Japanese Patent Office in application No. 2021-163244.
Decision of Dismissal of Amendment dated May 9, 2023 from the Japanese Patent Office in application No. 2021-163244.

* cited by examiner

1

POWER MODULE INCLUDING HIGHLY-HEAT-DISSIPATING INSULATION ADHESIVE SHEET

BACKGROUND OF THE INVENTION

1. Field of the Invention

The present disclosure relates to a power module, a power semiconductor device, and manufacturing methods therefor.

2. Description of the Background Art

In a power module used mainly for power conversion, a semiconductor element is joined to a heat spreader or the like having heat conducting property by means of a joining member, and the semiconductor element and the heat spreader are sealed by a resin member. In recent years, increase of the capacities and decrease of the sizes of power modules have been progressing, and power modules that have small sizes and favorable cooling efficiencies and that are highly reliable, have been required. In order to realize increase of the capacity of a power module without increasing the size of a semiconductor element, heat generated by the semiconductor element needs to be efficiently diffused to outside since high current is caused to flow in the semiconductor element. Thus, attempts have been made to decrease the thermal resistances of a heat dissipation member, an insulation member, and a joining member that are provided between a semiconductor element and a cooler such as a heatsink.

The thermal resistances of the heat dissipation member, the insulation member, and the joining member are compared as follows. The heat dissipation member and the joining member are members that serve mainly to cause current to flow, and thus, in general, the thermal resistances of these members are low. Meanwhile, the insulation member serves to insulate and separate the cooler and the semiconductor element from each other in a power module provided with the cooler, and thus the thermal resistance of the insulation member tends to become high. A member for realizing decrease of the thermal resistance of an insulation member is disclosed (see, for example, Patent Document 1).

The disclosed insulation member is configured as a board of a nitride-based ceramic resin complex in which a porous nitride-based ceramic sintered body having three-dimensionally continuous pores has been impregnated with a thermosetting resin composition in an incompletely cured state. Patent Document 1 describes, in an example, that a dielectric breakdown voltage was 10.0 kV and a thermal conductivity at 25° C. was 100 W/(m·K) owing to the disclosed configuration. These values are values applicable to an insulation member that insulates and separates a cooler and a semiconductor element from each other and that decreases the thermal resistance of the interval between the cooler and the semiconductor element.

A configuration of a semiconductor device having an insulation resin layer which is a conventional insulation member, is disclosed (see, for example, Patent Document 2). The insulation resin layer is provided between a copper plate and a heat spreader which is mounted with a semiconductor element, and a cooler is thermally connected to the copper plate. The disclosed insulation resin layer has a configuration in which an inorganic powder filler having high heat conducting property such as ceramic particles is contained in a thermosetting resin such as epoxy resin. It is described that ceramic particles of aluminum nitride, silicon nitride, boron nitride, aluminum oxide (alumina), silicon oxide (silica), magnesium oxide, zinc oxide, titanium oxide, and the like are suitable as the inorganic filler having high heat conducting property.

Patent Document 1: WO2019/111978

Patent Document 2: Japanese Laid-Open Patent Publication No. 2021-111765

In the above Patent Document 1, the board of the nitride-based ceramic resin complex has an excellent dielectric breakdown voltage and an excellent thermal conductivity. However, Patent Document 1 does not disclose any specific configuration in which the board of the nitride-based ceramic resin complex is applied to a power module, but merely discloses processing the disclosed nitride-based ceramic resin complex into a heat-conducting insulation adhesive sheet and performing heating and pressure-bonding of the heat-conducting insulation adhesive sheet to an adherend such as a metal plate or a metal circuit board. It is inferred that, in order to obtain two metal circuit boards ensured to be insulated from each other, a board of a ceramic resin complex in which impregnation with a resin in a semi-cured state has been performed is interposed between the metal circuit boards, and heating and pressure-bonding are performed so as to configure the two metal circuit boards to be insulated from each other. If such a manufacturing method is employed, portions of the board of the ceramic resin complex that are in contact with the metal circuit boards are pressurized while an outer peripheral portion of the board of the ceramic resin complex that is not in contact with the metal circuit boards is kept in an unconstrained state, during the heating and pressure-bonding. The resin in a semi-cured state flows in a direction toward the unconstrained outer peripheral portion. At this time, with a focus on a pressure generated inside the ceramic resin complex, the internal pressure is maximized at the center of gravity of the ceramic resin complex, and meanwhile, at an unconstrained side surface of the ceramic resin complex, the pressure on the side surface portion is zero. Since the pressure applied to the inside of the board of the ceramic resin complex decreases in a direction toward the outer peripheral portion, a gap that is present inside the board of the ceramic resin complex, particularly, near the outer peripheral portion, cannot be filled with the resin. Consequently, a problem arises in that an electric discharge path is formed at a portion at which the gap remains, whereby the insulation reliability of the ceramic resin complex decreases.

In the above Patent Document 2, the insulation resin layer has no portion at which a gap remains after pressurization. Thus, the copper plate and the heat spreader which is mounted with the semiconductor element can be insulated from each other. However, a thermal conductivity that can be attained by the resin insulation layer having the disclosed configuration is about 16 W/(m·K) at most, and thus a problem arises in that decrease of the thermal resistance of the insulation member is not sufficient. In addition, both the thermosetting resin and the ceramic particles flow to the periphery during molding with the resin member, and thus a problem arises in that an electric discharge path is formed by the resin having flowed, whereby the insulation reliability decreases.

SUMMARY OF THE INVENTION

Considering this, an object of the present disclosure is to provide: a power module and a power semiconductor device in which decrease of insulation reliability is inhibited and increase of heat dissipation is realized; and manufacturing methods therefor.

A power module according to the present disclosure includes: a heat spreader having a plate shape and having heat conducting property; a semiconductor element at least thermally connected to a one-side surface of the heat spreader; a highly-heat-dissipating insulation adhesive sheet having a plate shape and having a one-side surface thermally connected to an other-side surface of the heat spreader; a metal plate having a one-side surface thermally connected to an other-side surface of the highly-heat-dissipating insulation adhesive sheet; and a sealing resin member sealing the semiconductor element, the heat spreader, the highly-heat-dissipating insulation adhesive sheet, and the metal plate in a state where an other-side surface of the metal plate is exposed, wherein the highly-heat-dissipating insulation adhesive sheet is a complex obtained by impregnating, with a resin, a porous ceramic sintered body in which ceramic particles have a gap and have been integrally sintered.

A manufacturing method for a power module according to the present disclosure includes: a member preparation step of preparing a heat spreader having a plate shape and having heat conducting property, a semiconductor element at least thermally connected to a one-side surface of the heat spreader, a highly-heat-dissipating insulation adhesive sheet having a plate shape and having a one-side surface thermally connected to an other-side surface of the heat spreader, and a metal plate having a one-side surface thermally connected to an other-side surface of the highly-heat-dissipating insulation adhesive sheet; and a sealing resin member injection step of injecting under pressure a sealing resin member, which is uncured, into a mold in a state where the heat spreader, the semiconductor element, the highly-heat-dissipating insulation adhesive sheet, and the metal plate are placed in the mold, wherein the metal plate has an other-side surface exposed from the sealing resin member after execution of the sealing resin member injection step, the highly-heat-dissipating insulation adhesive sheet is a complex obtained by impregnating, with a resin, a porous ceramic sintered body in which ceramic particles have a gap and have been integrally sintered, the ceramic sintered body has a gap not filled with the resin before execution of the sealing resin member injection step, and the sealing resin member injection step includes pressurizing the highly-heat-dissipating insulation adhesive sheet by injection pressure of the sealing resin member so that the gap not filled with the resin is filled with the resin.

The power module according to the present disclosure includes: a heat spreader having a plate shape; a semiconductor element at least thermally connected to a one-side surface of the heat spreader; a highly-heat-dissipating insulation adhesive sheet having a plate shape and having a one-side surface thermally connected to an other-side surface of the heat spreader; a metal plate having a one-side surface thermally connected to an other-side surface of the highly-heat-dissipating insulation adhesive sheet; and a sealing resin member sealing these members in a state where an other-side surface of the metal plate is exposed, wherein the highly-heat-dissipating insulation adhesive sheet is a complex obtained by impregnating, with a resin, a porous ceramic sintered body in which ceramic particles have a gap and have been integrally sintered. Consequently, no electric discharge path is formed in the gap in the ceramic sintered body, and thus decrease of the insulation reliability of the power module can be inhibited. Since the highly-heat-dissipating insulation adhesive sheet is a complex obtained by impregnating, with a resin, a porous ceramic sintered body in which ceramic particles have a gap and have been integrally sintered, increase of heat dissipation in the power module can be realized.

The manufacturing method for the power module according to the present disclosure includes: a member preparation step of preparing a heat spreader having a plate shape, a semiconductor element at least thermally connected to a one-side surface of the heat spreader, a highly-heat-dissipating insulation adhesive sheet having a plate shape and having a one-side surface thermally connected to an other-side surface of the heat spreader, and a metal plate having a one-side surface thermally connected to an other-side surface of the highly-heat-dissipating insulation adhesive sheet; and a sealing resin member injection step of injecting under pressure a sealing resin member, which is uncured, into a mold in a state where the heat spreader, the semiconductor element, the highly-heat-dissipating insulation adhesive sheet, and the metal plate are placed in the mold, wherein the highly-heat-dissipating insulation adhesive sheet is a complex obtained by impregnating, with a resin, a porous ceramic sintered body in which ceramic particles have a gap and have been integrally sintered, the ceramic sintered body has a gap not filled with the resin before execution of the sealing resin member injection step, and the sealing resin member injection step includes pressurizing the highly-heat-dissipating insulation adhesive sheet by injection pressure of the sealing resin member so that the gap not filled with the resin is filled with the resin. Consequently, no electric discharge path is formed in the gap. This makes it possible to significantly improve the insulation reliability of the entire highly-heat-dissipating insulation adhesive sheet including an edge of the highly-heat-dissipating insulation adhesive sheet. Thus, decrease of the insulation reliability of the power module can be inhibited.

DETAILED DESCRIPTION OF THE PREFERRED EMBODIMENTS OF THE INVENTION

Figure 1:
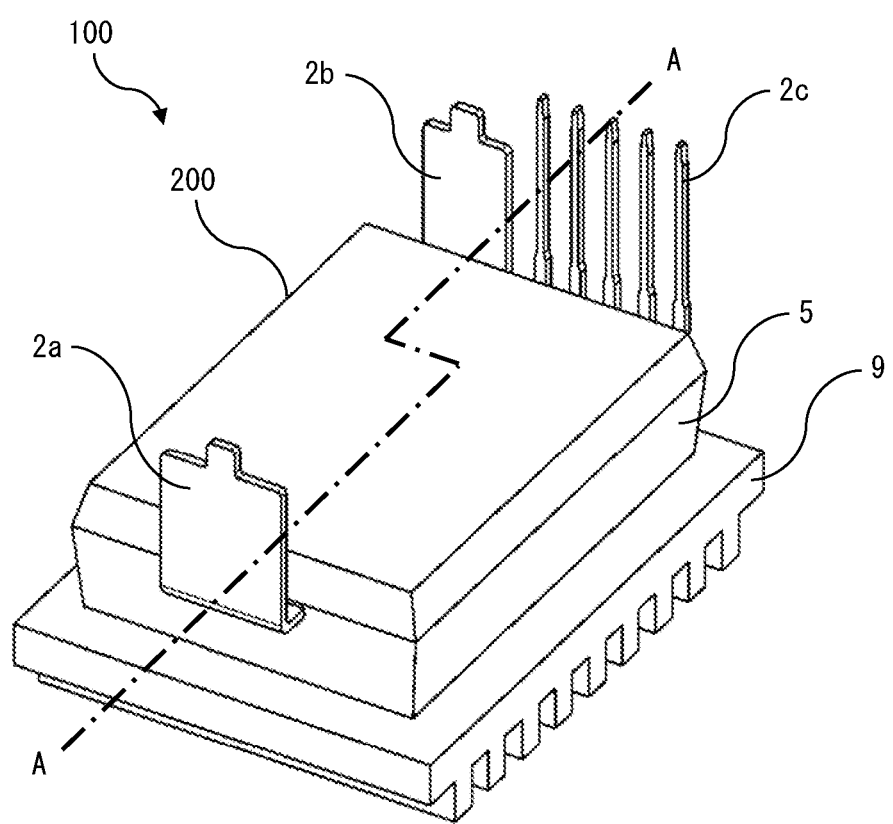
FIG. 1 is a perspective view schematically showing a power semiconductor device according to a first embodiment.

Hereinafter, power modules, power semiconductor devices, and manufacturing methods therefor according to embodiments of the present disclosure will be described with reference to the drawings. Description will be given while the same or corresponding members and portions in the drawings will be denoted by the same reference characters.

First Embodiment

Figure 2:
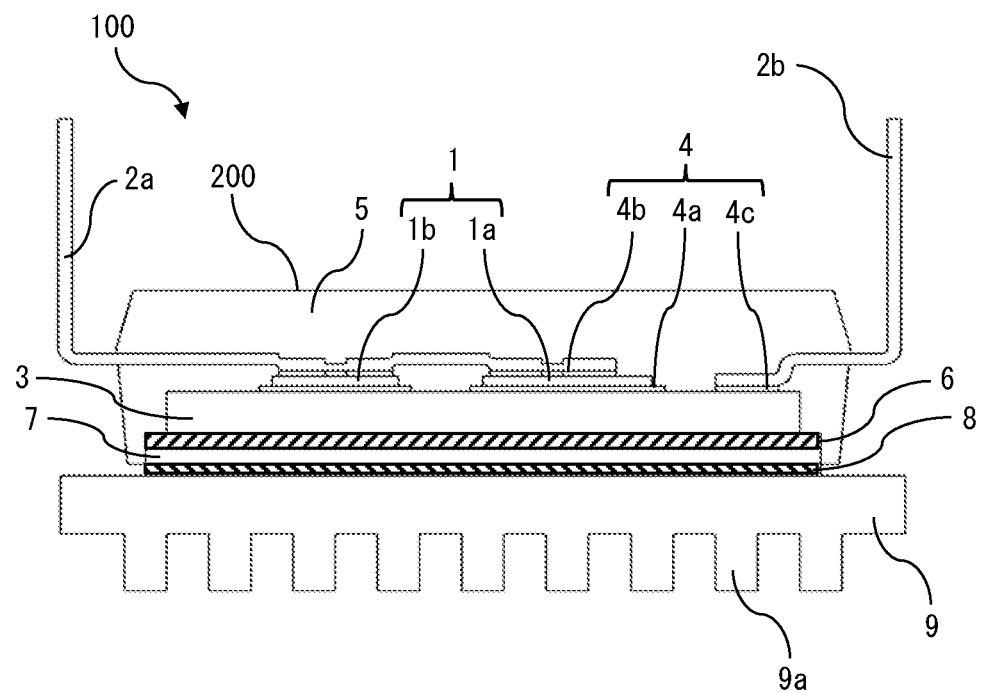
FIG. 2 is a cross-sectional view schematically showing the power semiconductor device, taken at the cross-sectional position A-A in FIG. 1.
Figure 3:
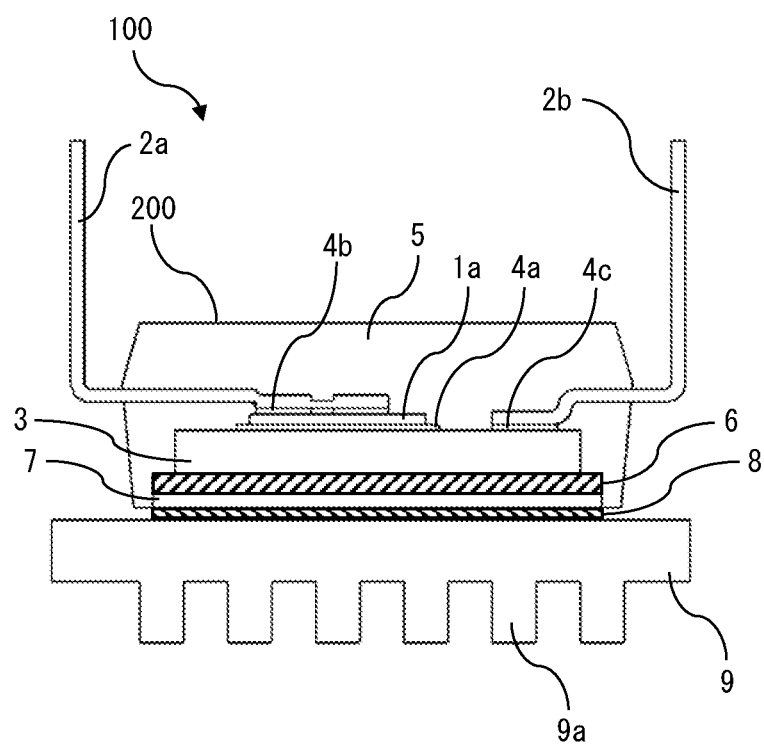
FIG. 3 is a cross-sectional view schematically showing another power semiconductor device according to the first embodiment.
Figure 4:
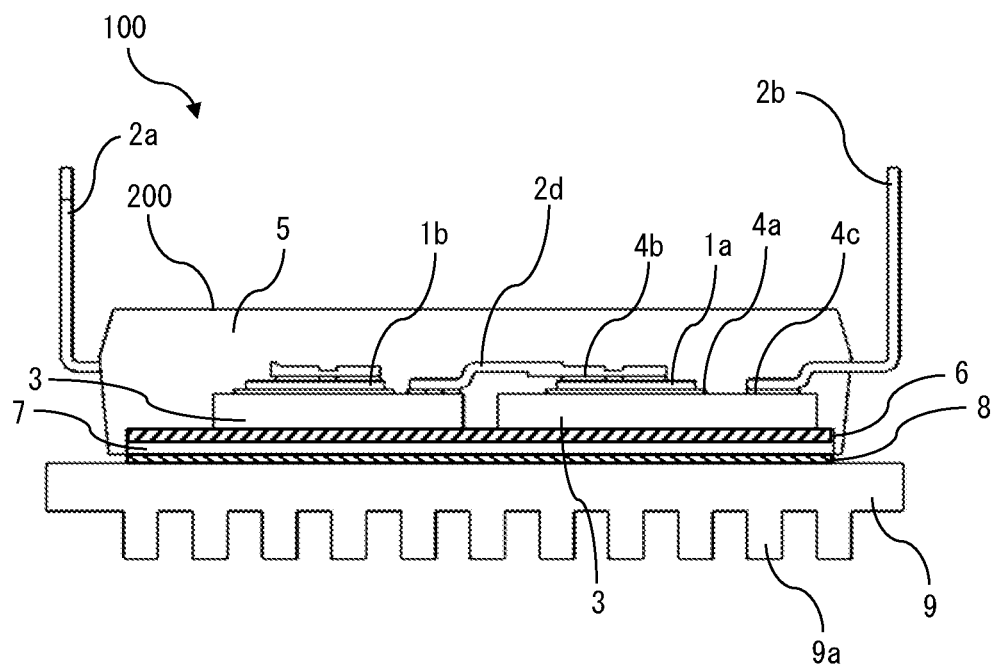
FIG. 4 is a cross-sectional view schematically showing another power semiconductor device according to the first embodiment.
Figure 5:
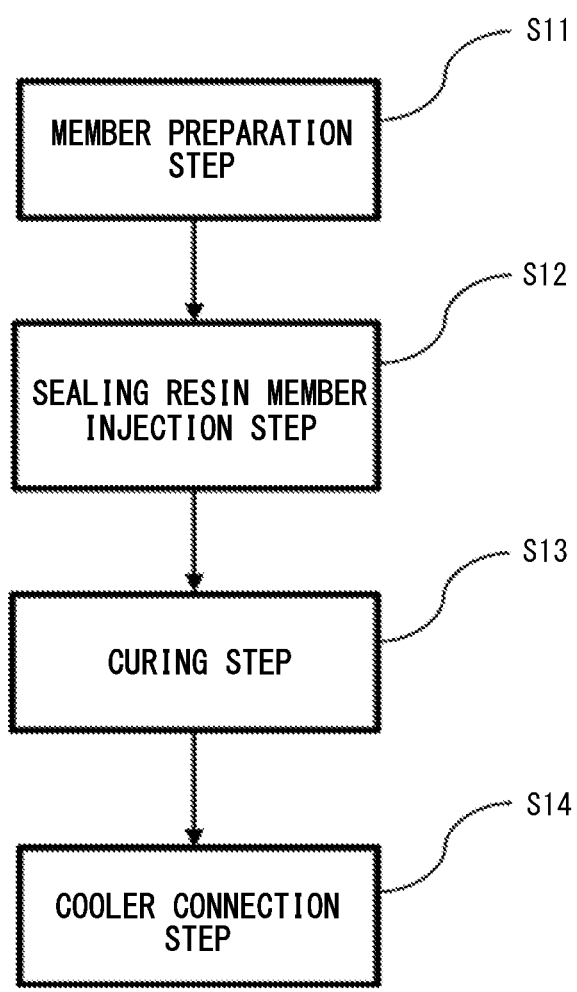
FIG. 5 illustrates a manufacturing process for the power semiconductor device according to the first embodiment.

FIG. 1 is a perspective view schematically showing a power semiconductor device 100 according to a first embodiment. FIG. 2 is a cross-sectional view schematically showing the power semiconductor device 100, taken at the cross-sectional position A-A in FIG. 1. FIG. 3 is a cross-sectional view schematically showing another power semiconductor device 100 according to the first embodiment. FIG. 4 is a cross-sectional view schematically showing another power semiconductor device 100 according to the first embodiment. FIG. 5 illustrates a manufacturing process for the power semiconductor device 100. The power semiconductor device 100 has a power module 200 mounted with semiconductor elements 1 such as power control semiconductor elements, and is used for a power conversion device or the like. In the cross-sectional views shown in the present embodiment, a surface in the upward direction of each member is defined as a one-side surface, and a surface in the downward direction of each member is defined as an other-side surface.

<Power Semiconductor Device 100>

The power semiconductor device 100 includes the power module 200 and a cooler 9. As shown in FIG. 2, the cooler 9 is thermally connected via a metal joining body 8 to a surface of a metal plate 7 that is exposed from a sealing resin member 5. The cooler 9 is formed from, for example, an aluminum alloy or a copper material which have excellent heat conducting properties. The material of the cooler 9 is preferably an aluminum alloy that, because of a low weight thereof, eliminates the need for consideration of the weight of the entire power semiconductor device 100 and that, because of an excellent corrosion resistance thereof, eliminates the need for consideration of influence of corrosion. As specific materials, ADC12 suitable for die casting, and A6063 applicable to forging and cutting work and having a high thermal conductivity, are more preferable.

The cooler 9 includes a plurality of heat dissipation fins 9a formed in a flat plate shape on a surface of the cooler 9 that is on an opposite side to the metal joining body 8. The heat dissipation fins 9a are provided to further efficiently dissipate, to outside, heat generated from each semiconductor element 1 inside the power module 200. The heat dissipation fins 9a are provided to the cooler 9 by means of cutting, die casting, forging, or the like. The heat dissipation structure to be provided to the cooler 9 is not limited to the heat dissipation fins 9a, and a flow path through which a cooling liquid such as water or antifreeze liquid is caused to pass may be formed in the cooler 9.

The metal joining body 8 is formed from, for example, a solder. The material of the metal joining body 8 is not limited to a solder and may be sintered Ag or sintered Cu which are highly-heat-conducting materials, and a joining method such as ultrasonic joining or welding may be selected. The material of the metal joining body 8 needs to be selected in consideration of balance with a material of a joining body 4 (described later) used inside the power module 200. For example, if each of the joining body 4 and the metal joining body 8 is formed from a solder, material selection should be performed such that: the solder of the metal joining body 8 has a low melting point; and the difference in melting point between the bodies is 30° C. or higher or, in consideration of mass productivity, 40° C. or higher. If the metal joining body 8 is formed from a solder having a higher melting point than the joining body 4, a portion of the joining body 4 used inside the power module 200 might melt at the time of connection by means of the metal joining body 8, whereby a malfunction might occur. If the joining body 4 is formed from sintered Ag or sintered Cu, the metal joining body 8 may be formed from a solder, or sintered Ag or sintered Cu.

By thus configuring the power semiconductor device 100, heat generated from the semiconductor element 1 inside the power module 200 can be efficiently dissipated from the cooler 9 to outside. Further, if the heat dissipation fins 9a are provided to the cooler 9, heat generated from the semiconductor element 1 can be further efficiently dissipated from the cooler 9 to outside.

<Power Module 200>

As shown in FIG. 2, the power module 200 includes: a heat spreader 3 having a plate shape and having heat conducting property; the semiconductor element 1 at least thermally connected to a one-side surface of the heat spreader 3; a highly-heat-dissipating insulation adhesive sheet 6 having a plate shape and having a one-side surface thermally connected to an other-side surface of the heat spreader 3; a metal plate 7 having a one-side surface thermally connected to an other-side surface of the highly-heat-dissipating insulation adhesive sheet 6; and the sealing resin member 5 sealing the semiconductor element 1, the heat spreader 3, the highly-heat-dissipating insulation adhesive sheet 6, and the metal plate 7 in a state where an other-side surface of the metal plate 7 is exposed. Although the power module 200 has two semiconductor elements 1a and 1b in the present embodiment, the number of the semiconductor elements 1 included by the power module 200 is not limited thereto. In the present embodiment, each semiconductor element 1 formed in a plate shape has an electrode on each of both surfaces thereof. If the semiconductor element 1 has an electrode on each of both surfaces thereof, the semiconductor element 1 is thermally and electrically connected to the one-side surface of the heat spreader 3. Meanwhile, if the semiconductor element 1 has an electrode only on a one-side surface thereof, the semiconductor element 1 is thermally connected to the one-side surface of the heat spreader 3.

The power module 200 further includes: a first lead frame 2a electrically connected to the one-side surface of the semiconductor element 1; a second lead frame 2b electrically connected to the one-side surface of the heat spreader 3; and third lead frames 2c (not shown in FIG. 2) electrically connected to a control pad provided on the one-side surface of the semiconductor element 1. The sealing resin member 5 seals the first lead frame 2a, the second lead frame 2b, and the third lead frames 2c such that an end portion of the first lead frame 2a that extends in a direction away from a portion of the first lead frame 2a that is connected to the semiconductor element 1, an end portion of the second lead frame 2b that extends in a direction away from a portion of the second lead frame 2b that is connected to the heat spreader 3, and an end portion of each third lead frame 2c that extends in a direction away from a portion of the third lead frame 2c that is connected to the semiconductor element 1, are exposed.

Figure 7:
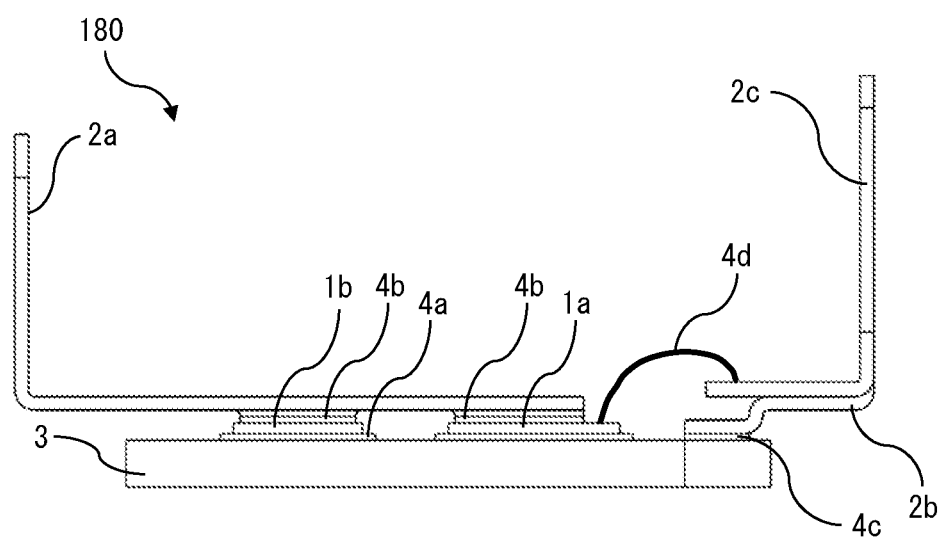
FIG. 7 is a side view of a power module intermediate in the manufacturing process for the power semiconductor device according to the first embodiment.

The semiconductor elements 1a and 1b are connected to the one-side surface of the heat spreader 3 by means of respective joining bodies 4a. Principal current is conducted in the first lead frame 2a and the second lead frame 2b. The first lead frame 2a is connected to the one-side surfaces of the semiconductor elements 1a and 1b by means of respective joining bodies 4b. The second lead frame 2b is connected to the one-side surface of the heat spreader 3 by means of a joining body 4c. Control current is conducted in the third lead frame 2c. The third lead frame 2c is connected to the control pad by means of a joining body 4d. The joining body 4d and the third lead frame 2c are shown in FIG. 7 explaining a manufacturing method described later.

By thus configuring the power module 200, heat generated when the semiconductor elements 1a and 1b are operated is transmitted in the order of the joining bodies 4a, the heat spreader 3, the highly-heat-dissipating insulation adhesive sheet 6, and the metal plate 7. Heat transmitted to the metal plate 7 is transmitted via the metal joining body 8 to the cooler 9 and dissipated from the cooler 9 to outside.

The power module 200 is desirably configured such that: the highly-heat-dissipating insulation adhesive sheet 6 and the heat spreader 3 are in contact with each other, and the highly-heat-dissipating insulation adhesive sheet 6 and the metal plate 7 are in contact with each other; and only a component of the highly-heat-dissipating insulation adhesive sheet 6 is interposed between the highly-heat-dissipating insulation adhesive sheet 6 and the heat spreader 3, and between the highly-heat-dissipating insulation adhesive sheet 6 and the metal plate 7. When the constituents inside the power module 200 are sealed by the sealing resin member 5, the sealing resin member 5 may be interposed between the highly-heat-dissipating insulation adhesive sheet 6 and the heat spreader 3, and between the highly-heat-dissipating insulation adhesive sheet 6 and the metal plate 7. If the sealing resin member 5 is interposed therebetween, a portion at which the sealing resin member 5 is interposed is thicker, by the thickness of the interposed sealing resin member 5, than the other portion at which the sealing resin member 5 is not interposed. Accordingly, the heat dissipation quality of the portion at which the sealing resin member 5 is interposed deteriorates. If the highly-heat-dissipating insulation adhesive sheet 6 and the heat spreader 3 are in contact with each other and the highly-heat-dissipating insulation adhesive sheet 6 and the metal plate 7 are in contact with each other, only the component of the highly-heat-dissipating insulation adhesive sheet 6 is interposed between the highly-heat-dissipating insulation adhesive sheet 6 and the heat spreader 3, and between the highly-heat-dissipating insulation adhesive sheet 6 and the metal plate 7. Therefore, decrease of the heat dissipation quality of the power module 200 can be prevented.

Adjustments of a mold retaining time, injection pressure of the sealing resin member 5, and the like in a sealing resin member injection step described later enable manufacturing so as to obtain the configuration in which the highly-heat-dissipating insulation adhesive sheet 6 and the heat spreader 3 are in contact with each other and the highly-heat-dissipating insulation adhesive sheet 6 and the metal plate 7 are in contact with each other. From the viewpoint of insulation quality and heat dissipation quality, the sealing resin member 5 or the like which is not the component of the highly-heat-dissipating insulation adhesive sheet 6 may be interposed at a portion where influences on insulation quality and heat dissipation quality are small, such as a portion near the outer periphery of the highly-heat-dissipating insulation adhesive sheet 6. However, a crack that occurs in a metal circuit board or the like may originate from the interposed member such as the sealing resin member 5. Thus, the configuration in which the highly-heat-dissipating insulation adhesive sheet 6 and the heat spreader 3 are in contact with each other and the highly-heat-dissipating insulation adhesive sheet 6 and the metal plate 7 are in contact with each other, is desirable.

<Constituents of Power Module 200>

Each of the constituents of the power module 200 will be described. Examples of the materials of the constituents are presented, and the materials are not limited to the described materials. Each of the semiconductor elements 1a and 1b is formed from, for example, Si. Each of the semiconductor elements 1a and 1b may be formed from a semiconductor material having a wide bandgap. A wide-bandgap semiconductor is formed from a material selected from the group consisting of SiC, GaN, GaO, and diamond. If each of the semiconductor elements 1a and 1b is formed from a semiconductor material having a wide bandgap, losses in the semiconductor elements 1a and 1b can be decreased. Since the losses in the semiconductor elements 1a and 1b can be decreased, the capacity of the power semiconductor device 100 can be easily increased.

Each of the first lead frame 2a, the second lead frame 2b, and the third lead frame 2c is formed from, for example, copper, aluminum, silver, or a copper-clad material which have high electric conductivities. Since high current needs to be conducted in the first lead frame 2a and the second lead frame 2b, a material having a low electric resistivity such as pure copper (C1020) is preferably selected. Each of the first lead frame 2a, the second lead frame 2b, and the third lead frame 2c is made of, for example, a plate metal obtained by punching a metal flat plate having a fixed thickness by means of a press die or the like.

In the present embodiment, the semiconductor element 1 is thermally and electrically connected to the one-side surface of the heat spreader 3. Thus, the heat spreader 3 is formed from, for example, copper, aluminum, silver, or a copper-clad material which have high electric conductivities, in the same manner as the above lead frames. Since the heat spreader 3 has a larger area than the lead frames, influence inflicted by the electric resistivity of the used material on electrical properties of the power module 200 is small. However, since the proportions of the volume and the mass of the heat spreader 3 in the power module 200 are large, the linear expansion coefficient of the heat spreader 3 inflicts large influences on the heat-cycle resistances of the highly-heat-dissipating insulation adhesive sheet 6 and the metal joining body 8. The heat-cycle resistance is an index of deterioration of the insulation quality and the heat dissipation quality of the power module 200 after a heat cycle test. If the material of the cooler 9 is A6063, the linear expansion coefficient of A6063 is 21 [ppm/K] to 25 [ppm/K]. If a material having a linear expansion coefficient approximate to that of A6063 is selected, the heat-cycle resistance is improved. Meanwhile, from the viewpoint of heat dissipation quality, increase of heat dissipation is more easily realized if a copper material is selected, than if a material satisfying the linear expansion coefficient being 21 [ppm/K] to 25 [ppm/K] is selected. Thus, it is favorable to select a constituent in consideration of the trade-off relationship between heat-cycle resistance and increase of heat dissipation.

The highly-heat-dissipating insulation adhesive sheet 6 is a complex obtained by impregnating, with a resin, a porous ceramic sintered body in which ceramic particles have a gap and have been integrally sintered. The gap in the ceramic sintered body is filled with the impregnating resin. The proportion of the gap in the ceramic sintered body is, for example, favorably equal to or lower than 10% and ideally 0%. The resin is, for example, a thermosetting resin composition. The highly-heat-dissipating insulation adhesive sheet 6 is sealed by the sealing resin member 5 in a state where the ceramic sintered body is impregnated with the resin in a semi-cured state. After the sealing, the highly-heat-dissipating insulation adhesive sheet 6 and the sealing resin member 5 are cured by post-mold curing. The highly-heat-dissipating insulation adhesive sheet 6 has, for example, a dielectric breakdown voltage of 10.0 kV and a thermal conductivity at 25° C. of 100 W/(m·K).

The metal plate 7 is formed from, for example, the same material as that of the heat spreader 3. If the metal plate 7 and the heat spreader 3 are formed from the same material, the highly-heat-dissipating insulation adhesive sheet 6 is sandwiched between the constituents formed from the same material, and thus the heat-cycle resistance is improved. Stress at a contact portion of the highly-heat-dissipating insulation adhesive sheet 6 generated by heat when the power module 200 and the cooler 9 are connected by means of the metal joining body 8, is mitigated, and the resistance of the contact portion of the highly-heat-dissipating insulation adhesive sheet 6 to a heat cycle during use of the power semiconductor device 100 becomes high. Ideally, it is desirable that the metal plate 7 and the heat spreader 3 have the same thickness. If the material of the metal plate 7 is oxygen-free copper which is the same as the material of the heat spreader 3, stress that is generated on the highly-heat-dissipating insulation adhesive sheet 6 does not change even when the metal plate 7 has a thickness of 0.3 mm or larger. Thus, the thickness of the metal plate 7 is preferably 0.3 mm or larger.

The sealing resin member 5 is, for example, a material in which an inorganic filler has been contained in a thermosetting resin such as epoxy resin. Stress that is generated on the sealing resin member 5 after sealing, is increased, and thus it is desirable to select, as the sealing resin member 5, a material having a linear expansion coefficient approximate to those of the constituents of the power module 200 such that no peel occurs between the sealing resin member 5 and the constituents. Specifically, the sealing resin member 5 is desirably a material having a linear expansion coefficient approximate to that of the heat spreader 3 having a high proportion of volume and a high proportion of mass in the power module 200. For example, if the heat spreader 3 is formed from oxygen-free copper, the linear expansion coefficient of the sealing resin member 5 is favorably 15 [ppm/K] to 19 [ppm/K]. The glass transition temperature Tg of the sealing resin member 5 is desirably equal to or higher than a maximum rated temperature of each of the semiconductor elements 1a and 1b and is, for example, 175° C. or higher.

The joining bodies 4a, 4b, and 4c are each formed from, for example, a solder. The material of each of the joining bodies 4a, 4b, and 4c is not limited to a solder and may be sintered Ag or sintered Cu which are highly-heat-conducting materials. The joining bodies 4b and 4c may be formed from the same material and may be joined together by using a means such as ultrasonic joining, since this enables concurrent connections thereof, i.e., from the viewpoint of manufacturability. Each joining body 4a is included in a heat dissipation path through which heat generated from the corresponding one of the semiconductor elements 1a and 1b is transmitted to the cooler 9. Thus, if a highly-heat-conducting material such as sintered Ag or sintered Cu is selected as a material of the joining body 4a, further increase of the capacity of the power module 200 can be realized. In addition, the configuration of the power semiconductor device 100 according to the present disclosure is a configuration in which, as explained with a manufacturing process described later, the semiconductor element 1 and the heat spreader 3 are connected by means of the joining body 4a before the highly-heat-dissipating insulation adhesive sheet 6 is provided. This configuration eliminates the need for imposing constraint conditions regarding temperature, pressurizing force, and the like on the connection by means of the joining body 4a. This elimination also contributes to increase of the capacity of the power semiconductor device 100. As shown in FIG. 7, the joining body 4d is, for example, a bonding wire. A bonding wire can be used as the joining body 4d because control current is a very small current as compared to power used for principal current. If a bonding wire is used as the joining body 4d, it is possible to select, for example, a material such as aluminum, copper, gold, or the like as a material of the bonding wire.

COMPARATIVE EXAMPLE

Figure 16:
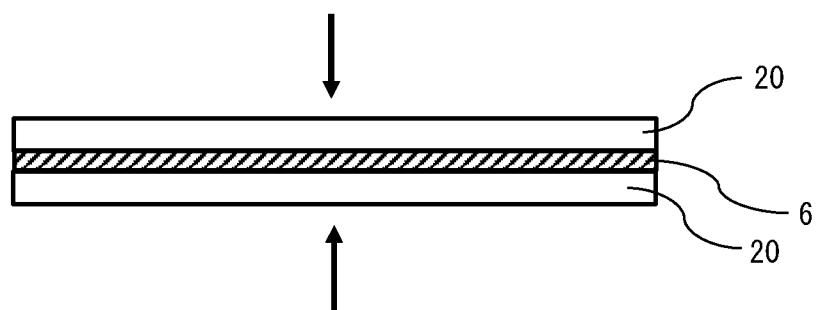
FIG. 16 illustrates a comparative example of the configuration in which a highly-heat-dissipating insulation adhesive sheet is used.

A comparative example in which the highly-heat-dissipating insulation adhesive sheet 6 is used will be described with reference to FIG. 16. FIG. 16 is a side view of the comparative example of the configuration in which the highly-heat-dissipating insulation adhesive sheet 6 is used. In the comparative example, metal circuit boards 20 each having a plate shape are respectively in contact with both surfaces of the highly-heat-dissipating insulation adhesive sheet 6 formed in a plate shape. In order to obtain two metal circuit boards 20 ensured to be insulated from each other, the highly-heat-dissipating insulation adhesive sheet 6 in which impregnation with the resin in a semi-cured state has been performed is interposed between the metal circuit boards 20, and heating and pressure-bonding are performed so as to configure the two metal circuit boards 20 to be insulated from each other. During pressure-bonding, pressures are applied in the directions indicated by the arrows in FIG. 16.

If the metal circuit boards 20 are manufactured by such a manufacturing method, portions of the highly-heat-dissipating insulation adhesive sheet 6 that are in contact with the metal circuit boards 20 are pressurized while an outer peripheral portion of the highly-heat-dissipating insulation adhesive sheet 6 that is not in contact with the metal circuit boards 20 is kept in an unconstrained state, during the heating and pressure-bonding. The resin in a semi-cured state flows in a direction toward the unconstrained outer peripheral portion. At this time, with a focus on a pressure generated inside the highly-heat-dissipating insulation adhesive sheet 6, the internal pressure is maximized at the center of gravity of the highly-heat-dissipating insulation adhesive sheet 6, and meanwhile, at the unconstrained outer peripheral portion of the highly-heat-dissipating insulation adhesive sheet 6, the pressure on the said outer peripheral portion is zero. Since the pressure applied to the inside of the board of the highly-heat-dissipating insulation adhesive sheet 6 decreases in a direction toward the outer peripheral portion, a gap that is present inside the board of the highly-heat-dissipating insulation adhesive sheet 6, particularly, near the outer peripheral portion, cannot be filled with the resin. Consequently, an electric discharge path is formed at a portion at which the gap remains, whereby the insulation reliability between the two metal circuit boards 20 decreases.

<Insulation Reliability of Highly-Heat-Dissipating Insulation Adhesive Sheet 6 in Present Disclosure>

The phenomenon involving the presence of a portion at which the gap remains after pressurization, is considered to more prominently occur in the highly-heat-dissipating insulation adhesive sheet 6 than in a conventional insulation resin layer in which an inorganic powder filler having high heat conducting property such as ceramic particles is contained in a thermosetting resin such as epoxy resin. The internal pressure of the highly-heat-dissipating insulation adhesive sheet 6 changes according to the viscosity and the flow rate of the flowing resin on the basis of fluid dynamics. Since a higher viscosity of the resin leads to a higher internal pressure, a higher viscosity of the resin makes it more likely for the gap to be filled with the resin. Thus, the insulation quality of the highly-heat-dissipating insulation adhesive sheet 6 becomes higher. However, if the outer peripheral portion of the highly-heat-dissipating insulation adhesive sheet 6 is unconstrained, the pressure on the outer peripheral portion is zero as described above. Either in the conventional insulation resin layer or the highly-heat-dissipating insulation adhesive sheet 6, the resin is softened and flows upon heating at the time of heating and pressure-bonding. In the conventional insulation resin layer, the resin and the ceramic particles flow together. Meanwhile, in the highly-heat-dissipating insulation adhesive sheet 6, the ceramic sintered body and the impregnating resin do not flow together. Thus, even if the same resin is used for the conventional insulation resin layer and the highly-heat-dissipating insulation adhesive sheet 6, the highly-heat-dissipating insulation adhesive sheet 6 has a higher resin flow rate and a lower nominal viscosity than the conventional insulation resin layer. Therefore, it is important for the highly-heat-dissipating insulation adhesive sheet 6 to have a structure that allows adhesion while improving the internal pressure.

In the present disclosure, the sealing resin member 5 which is uncured is injected under pressure into a mold in a state where the highly-heat-dissipating insulation adhesive sheet 6 and the like are placed in the mold. When the members including the highly-heat-dissipating insulation adhesive sheet 6 are sealed by the sealing resin member 5, the highly-heat-dissipating insulation adhesive sheet 6 is thermally connected to the heat spreader 3 and the metal plate 7 in a closed space, whereby a hydrostatic pressurizing force is generated in the entire highly-heat-dissipating insulation adhesive sheet 6 on the basis of Pascal's law. Before the sealing resin member 5 is injected into the mold, the ceramic sintered body has a gap not filled with the resin. Upon injection of the sealing resin member 5, the highly-heat-dissipating insulation adhesive sheet 6 is pressurized by injection pressure of the sealing resin member 5 so that the gap not filled with the resin is filled with the resin.

By thus configuring the power module 200, the gap in the ceramic sintered body is filled with the impregnating resin in the highly-heat-dissipating insulation adhesive sheet 6. Consequently, no electric discharge path is formed in the gap, whereby decrease of the insulation reliability of the power module 200 can be inhibited. The highly-heat-dissipating insulation adhesive sheet 6 is a complex obtained by impregnating, with the resin, the porous ceramic sintered body in which the ceramic particles have the gap and have been integrally sintered, and thus, since the highly-heat-dissipating insulation adhesive sheet 6 has a thermal conductivity at 25° C. of, for example, 100 W/(m·K), increase of heat dissipation in the power module 200 can be realized.

<Electrical Configuration of Power Module 200>

An electrical connection configuration of the power module 200 will be described. Each of the semiconductor elements 1a and 1b has an active surface portion and a passive surface portion on the one-side surface thereof and has an active surface portion on the other-side surface thereof, for example. Principal current of the power semiconductor device 100 is conducted to these active surface portions. The active surface portion on the one-side surface of each of the semiconductor elements 1a and 1b is connected to the first lead frame 2a by means of the corresponding joining body 4b so that power is inputted from, and outputted to, outside of the power module 200. The active surface portion on the other-side surface of each of the semiconductor elements 1a and 1b is connected to the heat spreader 3 by means of the corresponding joining body 4a so that power is inputted from, and outputted to, outside of the power module 200 via the second lead frame 2b connected to the heat spreader 3. If the semiconductor elements 1a and 1b are switching elements, the passive surface portions on the front surface portions thereof are provided with control pads related to operations of the semiconductor elements 1a and 1b. There is also a case where protective control pads intended for overheat protection and overcurrent protection of the semiconductor elements 1a and 1b are provided. These control pads are connected to the third lead frames 2c by means of the joining body 4d. The joining body 4d and the third lead frames 2c are shown in FIG. 7 explaining a manufacturing method described later.

Examples of the types of the semiconductor elements 1a and 1b and the electrical configuration of the power module 200 will be described with reference to FIG. 2 to FIG. 4. In FIG. 2, the semiconductor element 1a is a switching element, and the semiconductor element 1b is a diode. The switching element is a metal-oxide-semiconductor field-effect transistor (MOSFET) or an insulated gate bipolar transistor (IGBT). If one more power module 200 having the same configuration is disposed to be line-symmetric with an end portion of the first lead frame 2a that is exposed from the sealing resin member 5, and both lead frames are connected to each other, the two power modules 200 can perform, for example, an inverter operation. Each power module 200 in such a configuration is called an arm. One of the power modules 200 is referred to as an upper arm, and the other power module 200 is referred to as a lower arm. In each arm, current conduction from the second lead frame 2b to the first lead frame 2a is referred to as forward-direction current conduction and is made only on the switching element side. Meanwhile, current conduction from the first lead frame 2a to the second lead frame 2b is referred to as backflow current conduction and is made only in the diode.

In FIG. 3, the power module 200 has only the semiconductor element 1a. The semiconductor element 1a is a switching element that includes a function of a diode, and is, for example, an RC-IGBT or an SiC-MOSFET. In this case, current flows to the semiconductor element 1a either in the forward direction or the backflow direction. Since heat generation occurs in the same element either in the forward direction or the backflow direction, the amount of heat generation is larger so that a more highly-heat-dissipating structure is needed, than in the configuration shown in FIG. 2 in which the switching element and the diode are combined.

FIG. 4 shows a configuration in which an upper arm and a lower arm are integrated in one power module 200. Each of the semiconductor elements 1a and 1b is a switching element that includes a function of a diode, and is, for example, an RC-IGBT or an SiC-MOSFET. The semiconductor elements 1a and 1b are respectively connected to separate heat spreaders 3, and a fourth lead frame 2d makes connection between the two heat spreaders 3. With such a configuration, the size of the power semiconductor device 100 can be decreased. Although an example in which only one element is mounted on each heat spreader 3 has been presented in FIG. 4, a configuration in which two or more switching elements are mounted on one heat spreader 3 or a configuration in which two or more diodes are mounted on one heat spreader 3, may be employed. Alternatively, a configuration in which a plurality of the upper and lower arms are integrated may be employed.

At the time of an operation of the power semiconductor device 100, a voltage that is, at most, equal to an element withstand voltage of each of the semiconductor elements 1a and 1b is generated between the power module 200 and the cooler 9. The cooler 9 is always provided to be fixed to a base (not shown). A base portion is a portion that a person can touch by a hand. If dielectric breakdown occurs in the power semiconductor device 100, high voltage is applied to the base portion. In the power semiconductor device 100, insulation between the cooler 9 and each of the first lead frame 2a and the second lead frame 2b is ensured with a space insulation distance obtained in consideration of the creeping discharge resistance of the sealing resin member 5. Further, insulation between the heat spreader 3 and the cooler 9 is ensured with a solid insulation withstand voltage of the highly-heat-dissipating insulation adhesive sheet 6. When heat generated from each of the semiconductor elements 1a and 1b is dissipated to the cooler 9, the dissipation always occurs via the highly-heat-dissipating insulation adhesive sheet 6. Thus, setting of the thickness of the highly-heat-dissipating insulation adhesive sheet 6 to be large in order to ensure insulation, leads to decrease of heat dissipation quality. Since ensuring of insulation and increase of heat dissipation are in a trade-off relationship, the power semiconductor device 100 needs to be designed in view of both effects.

<Manufacturing Method for Power Semiconductor Device 100>

A manufacturing method for the power semiconductor device 100 will be described with reference to FIG. 5. The manufacturing method for the power semiconductor device 100 includes a member preparation step (S11), a sealing resin member injection step (S12), a curing step (S13), and a cooler connection step (S14). First three steps S11, S12, and S13 among the four steps constitute a manufacturing method for the power module 200.

The details of each step will be described. Here, a manufacturing method for the power semiconductor device 100 having the configuration shown in FIG. 2 will be described. The member preparation step is a step of preparing: the heat spreader 3 having a plate shape and having heat conducting property; the semiconductor elements 1a and 1b at least thermally connected to the one-side surface of the heat spreader 3; the highly-heat-dissipating insulation adhesive sheet 6 having a plate shape and having the one-side surface thermally connected to the other-side surface of the heat spreader 3; and the metal plate 7 having the one-side surface thermally connected to the other-side surface of the highly-heat-dissipating insulation adhesive sheet 6. The power semiconductor device 100 shown in FIG. 2 further includes the first lead frame 2a, the second lead frame 2b, and the third lead frames 2c, and thus these frames are also prepared in the present step.

Figure 6:
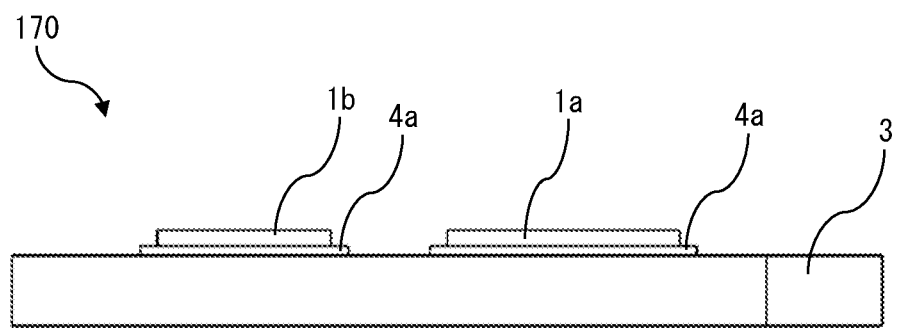
FIG. 6 is a side view of a power module intermediate in the manufacturing process for the power semiconductor device according to the first embodiment.
Figure 8:
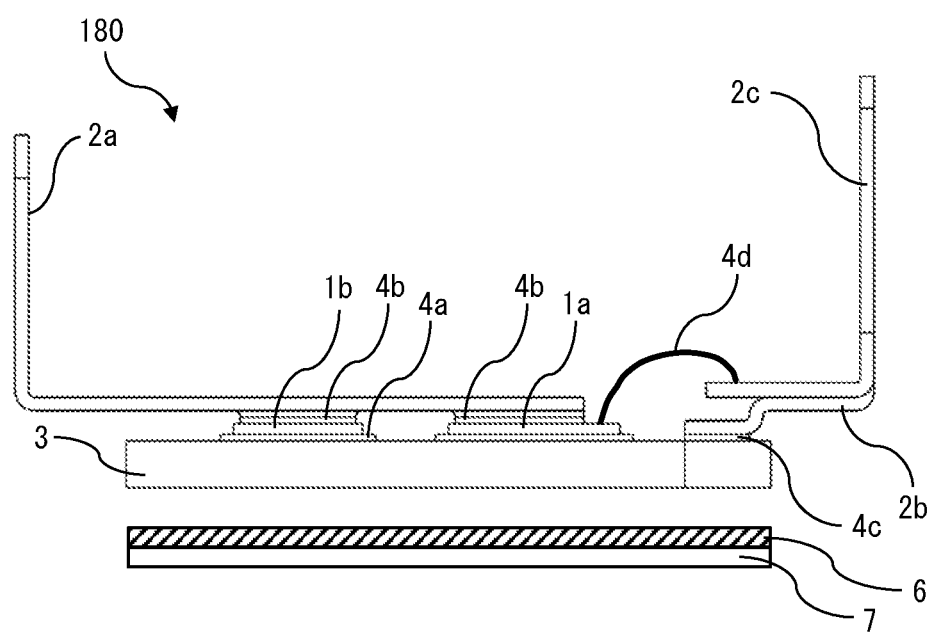
FIG. 8 is a diagram for explaining the manufacturing process for the power semiconductor device according to the first embodiment.

The member preparation step includes a plurality of steps. FIG. 6 and FIG. 7 are side views of power module intermediates 170 and 180 in the manufacturing process for the power semiconductor device 100. FIG. 8 is a diagram for explaining the manufacturing process for the power semiconductor device 100 according to the first embodiment. Each of the power module intermediates 170 and 180 is a structure obtained in the course of manufacturing the power module 200.

In a first step of the member preparation step, the semiconductor elements 1a and 1b are thermally and electrically connected to the one-side surface of the heat spreader 3 by using the respective joining bodies 4a as shown in FIG. 6, whereby the power module intermediate 170 is formed. In the next step, the first lead frame 2a is electrically connected to the one-side surfaces of the semiconductor elements 1a and 1b by using the respective joining bodies 4b as shown in FIG. 7. Then, the second lead frame 2b is electrically connected to the one-side surface of the heat spreader 3 by using the joining body 4c. Further, the third lead frames 2c are electrically connected to the control pad on the one-side surface of the semiconductor element 1a by using the joining body 4d. These lead frames are connected, whereby the power module intermediate 180 shown in FIG. 7 is formed. Connection of the first lead frame 2a using the joining bodies 4b and connection of the second lead frame 2b using the joining body 4c may be concurrently performed or may be performed in separate steps. In FIG. 7, each lead frame is bent in the upward direction in the drawing. However, the lead frame may be bent in a subsequent step.

In the next step, as shown in FIG. 8, the one-side surface of the highly-heat-dissipating insulation adhesive sheet 6 is thermally connected to the other-side surface of the heat spreader 3, and the one-side surface of the metal plate 7 is thermally connected to the other-side surface of the highly-heat-dissipating insulation adhesive sheet 6. The highly-heat-dissipating insulation adhesive sheet 6 and the heat spreader 3 may be integrated with each other when the power module intermediate 180 is placed in a mold in the next sealing resin member injection step. Likewise, although the metal plate 7 and the highly-heat-dissipating insulation adhesive sheet 6 are integrated with each other in FIG. 8, the highly-heat-dissipating insulation adhesive sheet 6 and the metal plate 7 may be integrated with each other when these members are placed in a mold in the next sealing resin member injection step.

The sealing resin member injection step is a step of injecting under pressure the sealing resin member 5, which is uncured, into a mold in a state where the heat spreader 3, the semiconductor elements 1a and 1b, the highly-heatdissipating insulation adhesive sheet 6, the metal plate 7, the first lead frame 2a, the second lead frame 2b, and the third lead frames 2c are placed in the mold. If the power module intermediate 180, the highly-heat-dissipating insulation adhesive sheet 6, and the metal plate 7 have not been integrated with each other, the metal plate 7, the highly-heat-dissipating insulation adhesive sheet 6, and the power module intermediate 180 are placed in this order in mold. The temperature of the mold is maintained at a fixed temperature in advance. The power module intermediate 180, the highly-heat-dissipating insulation adhesive sheet 6, and the metal plate 7 are retained in the mold for a predetermined time. The predetermined retaining time is, for example, 5 seconds or longer. After these members are retained for the predetermined retaining time, the sealing resin member 5 is injected into the mold under a fixed pressure. The sealing resin member injection step may involve transfer molding or injection molding. Further, a vacuum may be created before injection of the sealing resin member 5. The metal plate 7 has the other-side surface exposed from the sealing resin member 5 after execution of the sealing resin member injection step.

From the time at which the injection of the sealing resin member 5 is completed, an internal pressure is hydrostatically generated in the entire highly-heat-dissipating insulation adhesive sheet 6 on the basis of Pascal's law. The generated pressure is equal to a molding pressure which is the injection pressure. Thus, a higher internal pressure can be generated in the highly-heat-dissipating insulation adhesive sheet 6 than in the case of performing pressurization in a state where a side surface is unconstrained as in the comparative example. Before execution of the sealing resin member injection step, the ceramic sintered body of the highly-heat-dissipating insulation adhesive sheet 6 has a gap not filled with the resin. In the sealing resin member injection step, the entire highly-heat-dissipating insulation adhesive sheet 6 is pressurized by the injection pressure of the sealing resin member 5, whereby the gap not filled with the resin is filled with the resin. The proportion of the gap in the ceramic sintered body is, for example, favorably equal to or lower than 10% and ideally 0%. Since the gap not filled with the resin is filled with the resin, no electric discharge path is formed in the gap. Thus, the insulation reliability of the entire highly-heat-dissipating insulation adhesive sheet 6 including an edge of the highly-heat-dissipating insulation adhesive sheet 6 can be significantly improved. Since the insulation reliability of the highly-heat-dissipating insulation adhesive sheet 6 is improved, decrease of the insulation reliability of the power module 200 can be inhibited.

A thickness change rate of the highly-heat-dissipating insulation adhesive sheet 6 in the sealing resin member injection step is desirably equal to or higher than 1% and equal to or lower than 11%. If the sealing resin member injection step is performed under the condition that the thickness of the highly-heat-dissipating insulation adhesive sheet 6 does not change, the ceramic sintered body of the highly-heat-dissipating insulation adhesive sheet 6 does not follow a recess, a projection, and a distortion between the heat spreader 3 and the highly-heat-dissipating insulation adhesive sheet 6, and between the highly-heat-dissipating insulation adhesive sheet 6 and the metal plate 7. Consequently, an area of only the thermosetting resin composition which is the resin, may be formed. If the thickness change rate of the highly-heat-dissipating insulation adhesive sheet 6 in the sealing resin member injection step is set to be equal to or higher than 1% and equal to or lower than 11%, the ceramic sintered body of the highly-heat-dissipating insulation adhesive sheet 6 follows the recess, the projection, and the distortion. Consequently, the area of only the thermosetting resin composition is absent, and the heat dissipation quality of the power semiconductor device 100 can be improved. The thickness change rate of the highly-heat-dissipating insulation adhesive sheet 6 can be adjusted by, for example, optimizing the molding pressure and the retaining time in the sealing resin member injection step.

Figure 9:
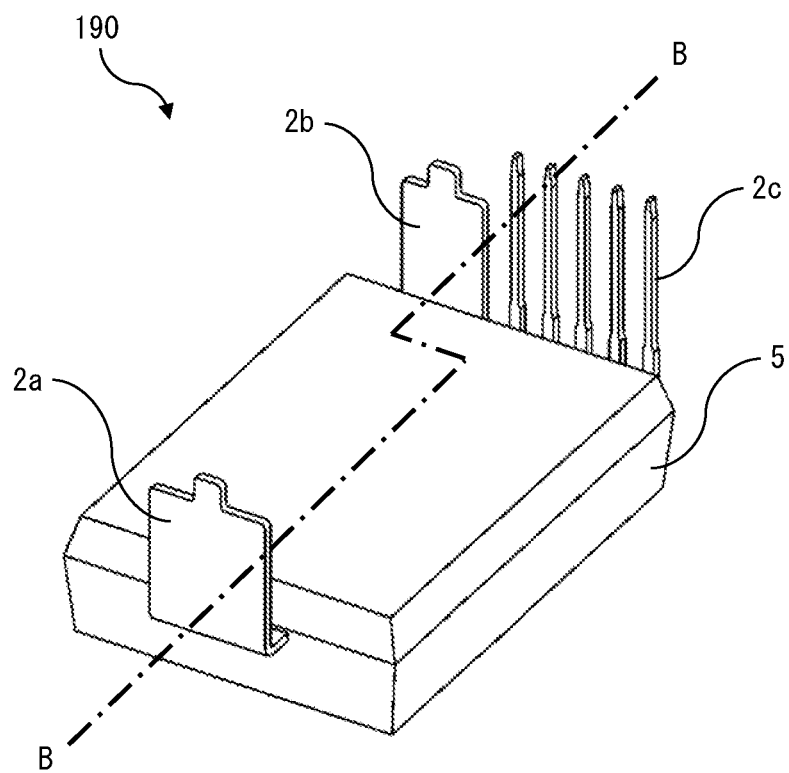
FIG. 9 is a perspective view of a power module intermediate in the manufacturing process for the power semiconductor device according to the first embodiment.
Figure 10:
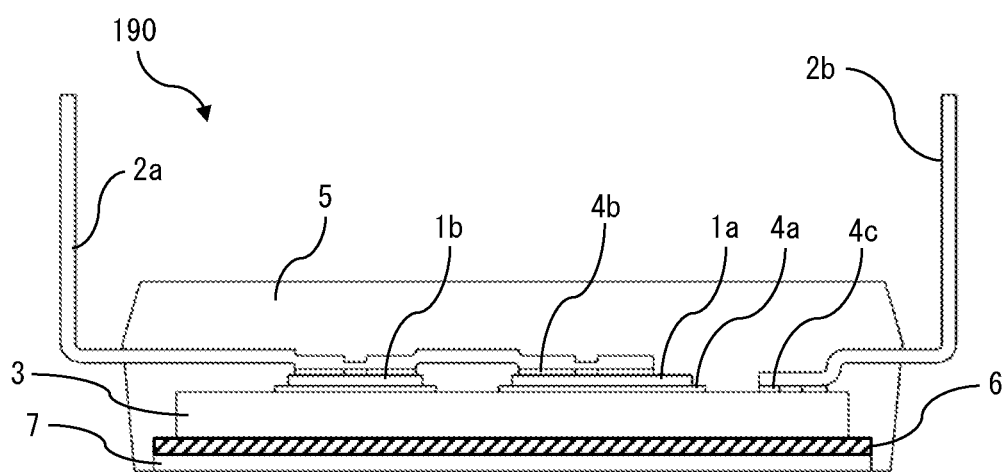
FIG. 10 is a cross-sectional view schematically showing the power module intermediate, taken at the cross-sectional position B-B in FIG. 9.

The curing step is a step of performing post-mold curing for concurrently curing the sealing resin member 5 and the resin of the highly-heat-dissipating insulation adhesive sheet 6 at a predetermined temperature. If the sealing resin member 5 and the resin of the highly-heat-dissipating insulation adhesive sheet 6 are thermosetting resins, the curing step is needed. The temperature in the post-mold curing is, for example, 175° C. FIG. 9 is a perspective view of a power module intermediate 190 having undergone the sealing resin member injection step. FIG. 10 is a cross-sectional view schematically showing the power module intermediate 190, taken at the cross-sectional position B-B in FIG. 9. As shown in FIG. 10, the end portions of the first lead frame 2a, the second lead frame 2b, and the third lead frames 2c (not shown in FIG. 10), and the other-side surface of the metal plate 7, are in a state of being exposed from the sealing resin member 5. If tie-bar cutting work for cutting the lead frames and terminal bending work have not been performed on the power module intermediate 190, the tie-bar cutting work and the terminal bending work are performed after the sealing resin member injection step and the curing step, whereby the power module 200 is formed.

The cooler connection step is a step of thermally connecting the cooler 9 via the metal joining body 8 to the other-side surface of the metal plate 7 that is exposed from the sealing resin member 5. Through the cooler connection step, the power semiconductor device 100 shown in FIG. 1 is formed. The temperature is increased to a predetermined temperature, and the power module 200 and the cooler 9 are connected via the metal joining body 8. For example, if the metal joining body 8 is formed from a solder, the temperature is increased to 200° C. or higher, and the power module 200 and the cooler 9 are connected. For the metal joining body 8, a material that is used with the temperature thereof being increased to a temperature at which the joining bodies 4a, 4b, and 4c are not melted again during the cooler connection step, is selected. If the joining bodies 4a, 4b, and 4c are melted again at the temperature to which the temperature of the metal joining body 8 has been increased, the insulation reliability of the power module 200 considerably decreases.

As described above, the power module 200 according to the first embodiment includes: the heat spreader 3 having a plate shape; the semiconductor elements 1a and 1b at least thermally connected to the one-side surface of the heat spreader 3; the highly-heat-dissipating insulation adhesive sheet 6 having a plate shape and having the one-side surface thermally connected to the other-side surface of the heat spreader 3; the metal plate 7 having the one-side surface thermally connected to the other-side surface of the highly-heat-dissipating insulation adhesive sheet 6; and the sealing resin member 5 sealing these members in a state where the other-side surface of the metal plate 7 is exposed. The highly-heat-dissipating insulation adhesive sheet 6 is a complex obtained by impregnating, with a resin, a porous ceramic sintered body in which ceramic particles have a gap and have been integrally sintered. Consequently, no electric discharge path is formed in the gap in the ceramic sintered body, and thus decrease of the insulation reliability of the power module 200 can be inhibited. The highly-heat-dissipating insulation adhesive sheet 6 is the complex obtained by impregnating, with the resin, the porous ceramic sintered body in which the ceramic particles have the gap and have been integrally sintered, and thus, since the highly-heat-dissipating insulation adhesive sheet 6 has a thermal conductivity at 25° C. of, for example, 100 W/(m·K), increase of heat dissipation in the power module 200 can be realized.

If the highly-heat-dissipating insulation adhesive sheet 6 and the heat spreader 3 are in contact with each other, and the highly-heat-dissipating insulation adhesive sheet 6 and the metal plate 7 are in contact with each other, only the component of the highly-heat-dissipating insulation adhesive sheet 6 is interposed between the highly-heat-dissipating insulation adhesive sheet 6 and the heat spreader 3, and between the highly-heat-dissipating insulation adhesive sheet 6 and the metal plate 7. Therefore, decrease of the heat dissipation quality of the power module 200 can be prevented. In addition, if each of the semiconductor elements 1a and 1b is formed from a semiconductor material having a wide bandgap, losses in the semiconductor elements 1a and 1b can be decreased. Since the losses in the semiconductor elements 1a and 1b can be decreased, the capacity of the power semiconductor device 100 can be easily increased.

The power semiconductor device 100 according to the first embodiment includes: the power module 200 according to the present disclosure; and the cooler 9 thermally connected via the metal joining body 8 to the surface of the metal plate 7 that is exposed from the sealing resin member 5. Consequently, heat generated from each of the semiconductor elements 1a and 1b inside the power module 200 can be efficiently dissipated from the cooler 9 to outside. The power module 200 according to the present disclosure can be manufactured in a mother factory, and the cooler connection step of connecting the cooler can be performed in another factory. Thus, the manufacturability of the power semiconductor device 100 can be improved, and manufacturing cost for the power semiconductor device 100 can be decreased.

The manufacturing method for the power module 200 according to the first embodiment includes: the member preparation step of preparing the heat spreader 3 having a plate shape, the semiconductor elements 1a and 1b at least thermally connected to the one-side surface of the heat spreader 3, the highly-heat-dissipating insulation adhesive sheet 6 having a plate shape and having the one-side surface thermally connected to the other-side surface of the heat spreader 3, and the metal plate 7 having the one-side surface thermally connected to the other-side surface of the highly-heat-dissipating insulation adhesive sheet 6; and the sealing resin member injection step of injecting under pressure the sealing resin member 5, which is uncured, into a mold in a state where the heat spreader 3, the semiconductor elements 1a and 1b, the highly-heat-dissipating insulation adhesive sheet 6, and the metal plate 7 are placed in the mold. The metal plate 7 has the other-side surface exposed from the sealing resin member 5 after execution of the sealing resin member injection step. The highly-heat-dissipating insulation adhesive sheet 6 is a complex obtained by impregnating, with a resin, a porous ceramic sintered body in which ceramic particles have a gap and have been integrally sintered. The ceramic sintered body has a gap not filled with the resin before execution of the sealing resin member injection step. The sealing resin member injection step includes pressurizing the highly-heat-dissipating insulation adhesive sheet 6 by injection pressure of the sealing resin member 5 so that the gap not filled with the resin is filled with the resin. Consequently, no electric discharge path is formed in the gap. Thus, the insulation reliability of the entire highly-heat-dissipating insulation adhesive sheet 6 including the edge of the highly-heat-dissipating insulation adhesive sheet 6 can be significantly improved. Since the insulation reliability of the highly-heat-dissipating insulation adhesive sheet 6 is improved, decrease of the insulation reliability of each of the power module 200 and the power semiconductor device 100 can be inhibited.

If the thickness change rate of the highly-heat-dissipating insulation adhesive sheet 6 in the sealing resin member injection step is set to be equal to or higher than 1% and equal to or lower than 11%, the ceramic sintered body of the highly-heat-dissipating insulation adhesive sheet 6 follows a recess, a projection, and a distortion between the heat spreader 3 and the highly-heat-dissipating insulation adhesive sheet 6, and between the highly-heat-dissipating insulation adhesive sheet 6 and the metal plate 7. Consequently, the area of only the thermosetting resin composition which is the resin, is absent, and the heat dissipation quality of the power semiconductor device 100 can be improved. Since the manufacturing method for the power semiconductor device 100 according to the first embodiment includes the step of thermally connecting the cooler 9 via the metal joining body 8 to the surface of the metal plate 7 that is exposed from the sealing resin member 5, it is possible to easily manufacture a power semiconductor device 100 in which heat generated from each of the semiconductor elements 1a and 1b inside the power module 200 can be efficiently dissipated from the cooler 9 to outside.

Second Embodiment

Figure 11:
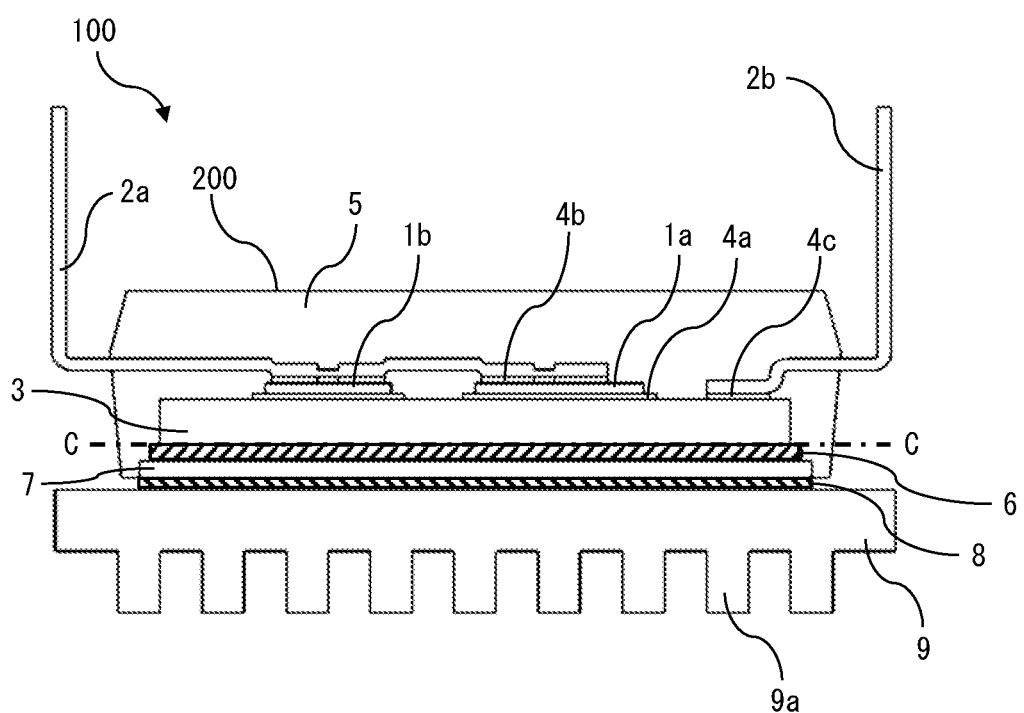
FIG. 11 is a cross-sectional view schematically showing a power semiconductor device according to a second embodiment.
Figure 12:
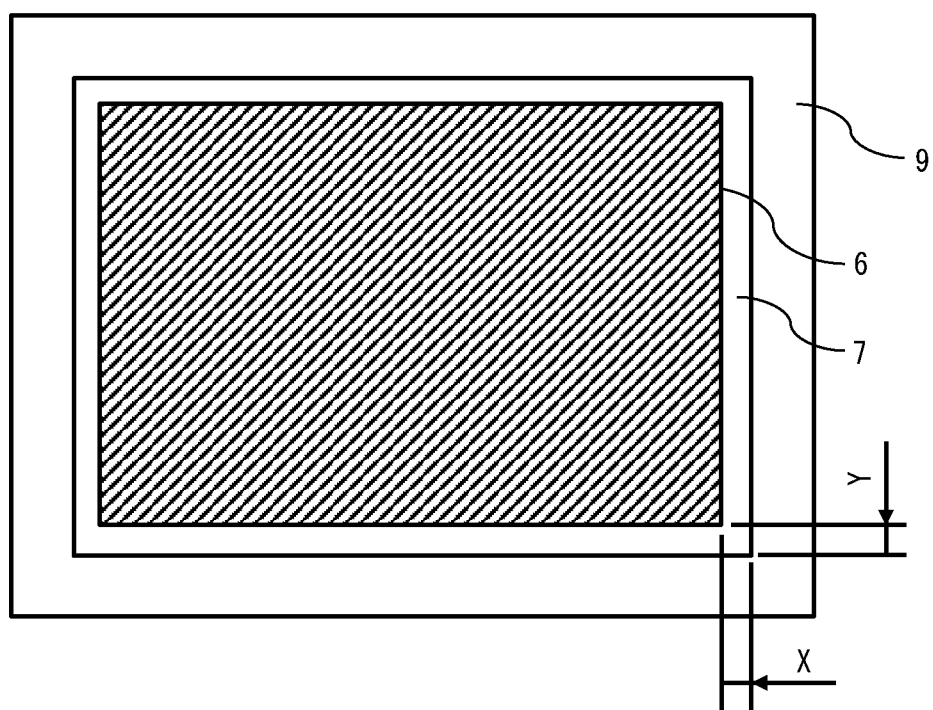
FIG. 12 is a cross-sectional view schematically showing the power semiconductor device, taken at the cross-sectional position C-C in FIG. 11.

A power semiconductor device 100 according to a second embodiment will be described. FIG. 11 is a cross-sectional view schematically showing the power semiconductor device 100 according to the second embodiment, taken at the same position as the cross-sectional position A-A in FIG. 1. FIG. 12 is a cross-sectional view schematically showing the power semiconductor device 100, taken at the cross-sectional position C-C in FIG. 11. In FIG. 12, the sealing resin member 5 is not shown. The power semiconductor device 100 according to the second embodiment is formed such that the highly-heat-dissipating insulation adhesive sheet 6 thereof has a size different from that in the first embodiment.

As seen in a direction perpendicular to the one-side surface of the metal plate 7, an outer periphery portion of the highly-heat-dissipating insulation adhesive sheet 6 is located inward of an outer periphery portion of the metal plate 7. In the present embodiment, as shown in FIG. 12, the highly-heat-dissipating insulation adhesive sheet 6 is smaller at each edge thereof in the lateral direction than the metal plate 7 by X. Meanwhile, the highly-heat-dissipating insulation adhesive sheet 6 is smaller at each edge thereof in the longitudinal direction than the metal plate 7 by Y. The magnitudes of X and Y are larger than 0, and the highly-heat-dissipating insulation adhesive sheet 6 is formed to have an arbitrarily-selected size. If, at the outer periphery portion of the highly-heat-dissipating insulation adhesive sheet 6, the resin protrudes from the highly-heat-dissipating insulation adhesive sheet 6, the outer periphery portion of the highly-heat-dissipating insulation adhesive sheet 6 including the protruding resin is set to be located inward of the outer periphery portion of the metal plate 7. The same applies also if the ceramic sintered body protrudes from the highly-heat-dissipating insulation adhesive sheet 6.

If the outer periphery portion of the highly-heat-dissipating insulation adhesive sheet 6 protrudes from the metal plate 7, flow of the sealing resin member 5 at the time of sealing the power module 200 leads to occurrence of chipping from the highly-heat-dissipating insulation adhesive sheet 6 or leads to generation of a crack in the highly-heat-dissipating insulation adhesive sheet 6. In the case where chipping from the highly-heat-dissipating insulation adhesive sheet 6 occurs, a fragment chipped from the highly-heat-dissipating insulation adhesive sheet 6 remains inside the power module 200 in association with the flow of the sealing resin member 5. Consequently, other members such as the semiconductor element 1 might be damaged, and the reliability of the power module 200 might be decreased. Meanwhile, in the case where a crack is generated in the highly-heat-dissipating insulation adhesive sheet 6, the insulation reliability of the power module 200 might be decreased. It is noted that, if only the resin of the highly-heat-dissipating insulation adhesive sheet 6 protrudes, the reliability of the power module 200 might be decreased owing to generation of a foreign substance due to the resin in the same manner as in the case where chipping from the highly-heat-dissipating insulation adhesive sheet 6 occurs.

As described above, in the power semiconductor device 100 according to the second embodiment, as seen in the direction perpendicular to the one-side surface of the metal plate 7, the outer periphery portion of the highly-heat-dissipating insulation adhesive sheet 6 is located inward of the outer periphery portion of the metal plate 7. Consequently, none of the edges of the outer periphery of the highly-heat-dissipating insulation adhesive sheet 6 protrudes from the metal plate 7. Thus, it is possible to inhibit: the risk that flow of the sealing resin member 5 at the time of sealing the power module 200 leads to occurrence of chipping from the highly-heat-dissipating insulation adhesive sheet 6; and the risk that the said flow leads to generation of a crack in the highly-heat-dissipating insulation adhesive sheet 6. Since the risk of occurrence of chipping from the highly-heat-dissipating insulation adhesive sheet 6 and the risk of generation of a crack in the highly-heat-dissipating insulation adhesive sheet 6 are inhibited, the reliability of each of the power module 200 and the power semiconductor device 100 can be improved.

Third Embodiment

Figure 13:
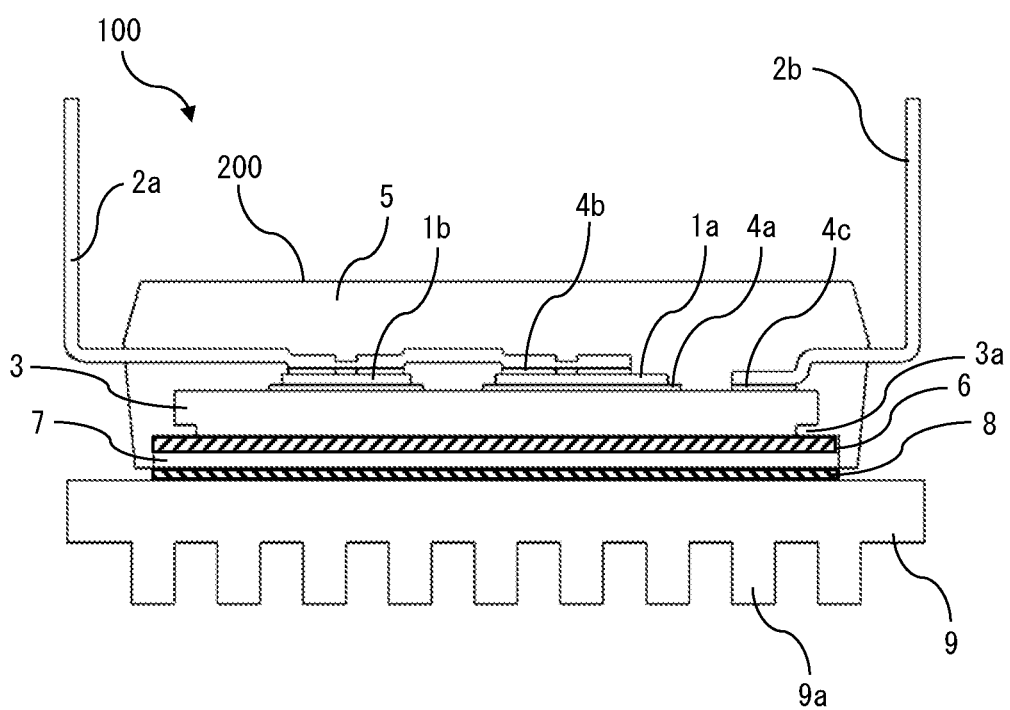
FIG. 13 is a cross-sectional view schematically showing a power semiconductor device according to a third embodiment.

A power semiconductor device 100 according to a third embodiment will be described. FIG. 13 is a cross-sectional view schematically showing the power semiconductor device 100 according to the third embodiment, taken at the same position as the cross-sectional position A-A in FIG. 1. The power semiconductor device 100 according to the third embodiment is configured such that a step 3a is formed in a side surface of the heat spreader 3.

As seen in a direction perpendicular to the one-side surface of the heat spreader 3, an outer periphery portion of the surface, of the heat spreader 3, that is in contact with the highly-heat-dissipating insulation adhesive sheet 6 has at least one step 3a which is formed so as to be recessed from the outer periphery portion toward an inner portion of the heat spreader 3. Although one step 3a is provided in the present embodiment, the number of the steps 3a is not limited to one, and two or more steps 3a may be provided.

In the power semiconductor device 100, a stress that is generated on the highly-heat-dissipating insulation adhesive sheet 6 owing to a heat cycle caused when the power semiconductor device 100 is used and when the power module 200 and the cooler 9 are connected via the metal joining body 8, is largest at the outer periphery portion of the surface, of the heat spreader 3, that is in contact with the highly-heat-dissipating insulation adhesive sheet 6. The portion at which the stress increases, experiences heightening of the risk that chipping from the highly-heat-dissipating insulation adhesive sheet 6 occurs and the risk that a crack is generated in the highly-heat-dissipating insulation adhesive sheet 6.

As described above, in the power semiconductor device 100 according to the third embodiment, as seen in the direction perpendicular to the one-side surface of the heat spreader 3, the outer periphery portion of the surface, of the heat spreader 3, that is in contact with the highly-heat-dissipating insulation adhesive sheet 6 has at least one step 3a which is formed so as to be recessed from the outer periphery portion toward the inner portion of the heat spreader 3. Consequently, the area in which the heat spreader 3 and the sealing resin member 5 are in contact with each other increases at the portion at which the stress increases. Thus, the stress that is generated on the highly-heat-dissipating insulation adhesive sheet 6 can be decreased. Since the stress that is generated on the highly-heat-dissipating insulation adhesive sheet 6 is decreased, the heat-cycle resistance of the highly-heat-dissipating insulation adhesive sheet 6 is improved. Therefore, a power semiconductor device 100 having a high insulation reliability can be obtained.

Fourth Embodiment

Figure 14:
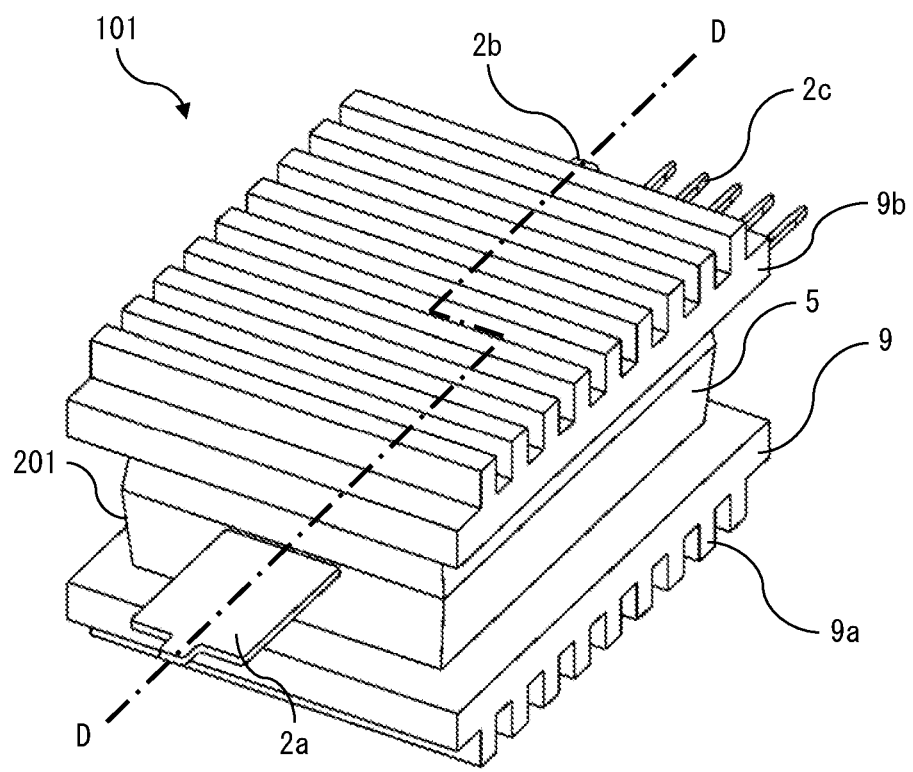
FIG. 14 is a perspective view schematically showing a power semiconductor device according to a fourth embodiment.
Figure 15:
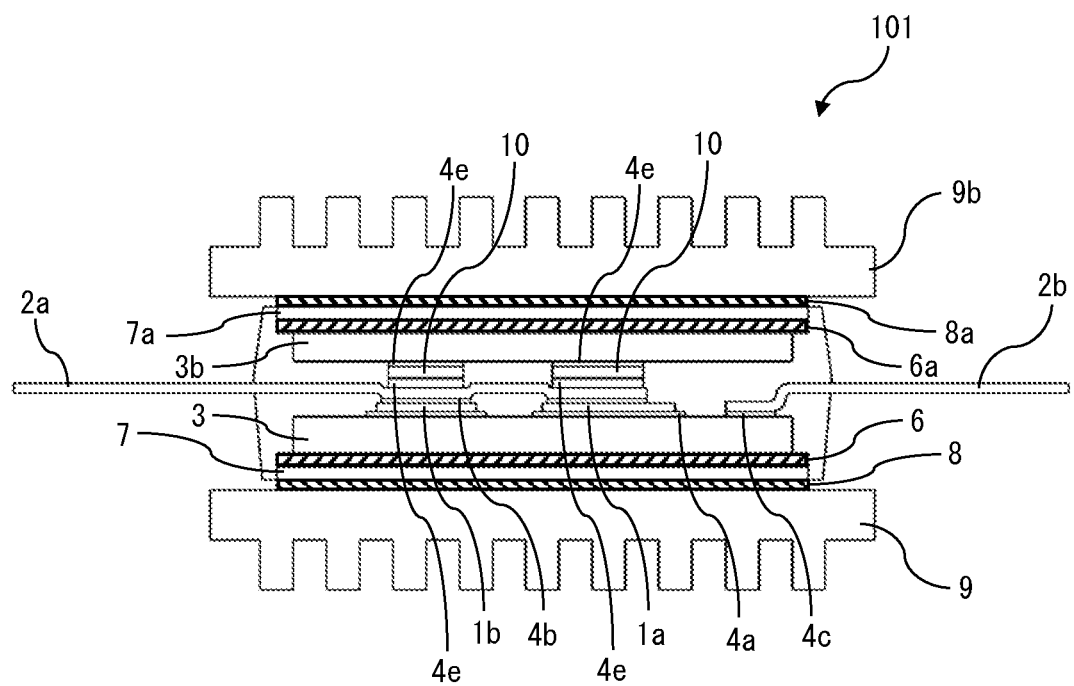
FIG. 15 is a cross-sectional view schematically showing the power semiconductor device, taken at the cross-sectional position D-D in FIG. 14.

A power semiconductor device 101 according to a fourth embodiment will be described. FIG. 14 is a perspective view schematically showing the power semiconductor device 101 according to the fourth embodiment. FIG. 15 is a cross-sectional view schematically showing the power semiconductor device 101, taken at the cross-sectional position D-D in FIG. 14. The power semiconductor device 101 according to the fourth embodiment includes two coolers 9 and 9b.

In addition to the constituents of the power module 200, a power module 201 includes: an additional heat spreader 3b which has a plate shape and has heat conducting property and to which surfaces of the semiconductor elements 1a and 1b that are on an opposite side to the heat spreader 3 are thermally connected; an additional highly-heat-dissipating insulation adhesive sheet 6a which has a plate shape and has heat conducting property and to which a surface of the additional heat spreader 3b that is on an opposite side to the semiconductor elements 1a and 1b is thermally connected; and an additional metal plate 7a to which a surface of the additional highly-heat-dissipating insulation adhesive sheet 6a that is on an opposite side to the additional heat spreader 3b is thermally connected. The sealing resin member 5 seals the additional heat spreader 3b, the additional highly-heat-dissipating insulation adhesive sheet 6a, and the additional metal plate 7a in a state where a surface of the additional metal plate 7a that is on an opposite side to the additional highly-heat-dissipating insulation adhesive sheet 6a is exposed.

In the present embodiment, the power module 201 includes the first lead frame 2a and metal spacers 10 between the additional heat spreader 3b and the semiconductor elements 1a and 1b. The first lead frame 2a is connected to the one-side surfaces of the semiconductor elements 1a and 1b by means of the joining bodies 4b. The metal spacers 10 are thermally connected to the first lead frame 2a by means of joining bodies 4e. The metal spacers 10 are thermally connected to the additional heat spreader 3*b* by means of joining bodies 4*e*. Each metal spacer 10 is formed from, for example, copper, aluminum, silver, or a copper-clad material in the same manner as the first lead frame 2*a*. Each joining body 4*e* is formed from, for example, a solder, sintered Ag, or sintered Cu in the same manner as the joining body 4*a*.

The power semiconductor device 101 includes the power module 201 and the coolers 9 and 9*b*. The cooler 9*b* is thermally connected via a metal joining body 8*a* to the surface of the additional metal plate 7*a* that is exposed from the sealing resin member 5. In the same manner as the cooler 9, the cooler 9*b* is formed from, for example, an aluminum alloy or a copper material which have excellent heat conducting properties. In the same manner as the metal joining body 8, the metal joining body 8*a* is formed from, for example, a solder, sintered Ag, or sintered Cu, but the material of the metal joining body 8*a* is not limited thereto.

Regarding a manufacturing method for the power module 201, features that are added to the manufacturing method for the power module 200 described in the first embodiment will be described. The member preparation step includes further preparing: the additional heat spreader 3*b* which has a plate shape and has heat conducting property and to which the surfaces of the semiconductor elements 1*a* and 1*b* that are on the opposite side to the heat spreader 3 are thermally connected; the additional highly-heat-dissipating insulation adhesive sheet 6*a* which has a plate shape and has heat conducting property and to which the surface of the additional heat spreader 3*b* that is on the opposite side to the semiconductor elements 1*a* and 1*b* is thermally connected; and the additional metal plate 7*a* to which the surface of the additional highly-heat-dissipating insulation adhesive sheet 6*a* that is on the opposite side to the additional heat spreader 3*b* is thermally connected. In the case where the power module 201 further includes the metal spacers 10 as shown in FIG. 15, the metal spacers 10 are also prepared.

The sealing resin member injection step includes injecting under pressure the sealing resin member 5, which is uncured, into a mold in a state where the heat spreader 3, the semiconductor elements 1*a* and 1*b*, the highly-heat-dissipating insulation adhesive sheet 6, the metal plate 7, the additional heat spreader 3*b*, the additional highly-heat-dissipating insulation adhesive sheet 6*a*, and the additional metal plate 7*a* are placed in the mold. The additional metal plate 7*a* has a surface exposed from the sealing resin member 5 after execution of the sealing resin member injection step, the surface being on an opposite side to a surface, of the additional metal plate 7*a*, to which the surface of the additional highly-heat-dissipating insulation adhesive sheet 6*a* is thermally connected. If the sealing resin member 5 and the resin of each of the highly-heat-dissipating insulation adhesive sheet 6 and the additional highly-heat-dissipating insulation adhesive sheet 6*a* are thermosetting resins, the curing step is further performed.

A manufacturing method for the power semiconductor device 101 will be described. The cooler connection step includes thermally connecting the cooler 9 via the metal joining body 8 to the surface of the metal plate 7 that is exposed from the sealing resin member 5, and thermally connecting the cooler 9*b* via the metal joining body 8*a* to the surface of the additional metal plate 7*a* that is exposed from the sealing resin member 5. The coolers 9 and 9*b* may be concurrently connected or separately connected. Manufacturing in this manner makes it possible to easily manufacture a power semiconductor device 101 in which heat generated from each of the semiconductor elements 1*a* and 1*b* inside the power module 201 can be efficiently dissipated from the coolers 9 and 9*b* to outside.

As described above, in the power semiconductor device 101 according to the fourth embodiment, the power module 201 further includes: the additional heat spreader 3*b* which has a plate shape and has heat conducting property and to which the surfaces of the semiconductor elements 1*a* and 1*b* that are on the opposite side to the heat spreader 3 are thermally connected; the additional highly-heat-dissipating insulation adhesive sheet 6*a* which has a plate shape and has heat conducting property and to which the surface of the additional heat spreader 3*b* that is on the opposite side to the semiconductor elements 1*a* and 1*b* is thermally connected; and the additional metal plate 7*a* to which the surface of the additional highly-heat-dissipating insulation adhesive sheet 6*a* that is on the opposite side to the additional heat spreader 3*b* is thermally connected. The sealing resin member 5 seals the additional heat spreader 3*b*, the additional highly-heat-dissipating insulation adhesive sheet 6*a*, and the additional metal plate 7*a* in a state where the surface of the additional metal plate 7*a* that is on the opposite side to the additional highly-heat-dissipating insulation adhesive sheet 6*a* is exposed. Consequently, further increase of heat dissipation in the power module 201 can be realized. Since further increase of heat dissipation in the power module 201 is realized, it is possible to further increase the output of the power semiconductor device 101 and further decrease the size of the power semiconductor device 101.

In the manufacturing method for the power module 201 according to the fourth embodiment, the member preparation step includes further preparing: the additional heat spreader 3*b* which has a plate shape and has heat conducting property and to which the surfaces of the semiconductor elements 1*a* and 1*b* that are on the opposite side to the heat spreader 3 are thermally connected; the additional highly-heat-dissipating insulation adhesive sheet 6*a* which has a plate shape and has heat conducting property and to which the surface of the additional heat spreader 3*b* that is on the opposite side to the semiconductor elements is thermally connected; and the additional metal plate 7*a* to which the surface of the additional highly-heat-dissipating insulation adhesive sheet 6*a* that is on the opposite side to the additional heat spreader 3*b* is thermally connected. The sealing resin member 5, which is uncured, is injected under pressure into a mold in a state where the heat spreader 3, the semiconductor elements 1*a* and 1*b*, the highly-heat-dissipating insulation adhesive sheet 6, the metal plate 7, the additional heat spreader 3*b*, the additional highly-heat-dissipating insulation adhesive sheet 6*a*, and the additional metal plate 7*a* are placed in the mold. The additional metal plate 7*a* has a surface exposed from the sealing resin member 5 after execution of the sealing resin member injection step, the surface being on the opposite side to the surface, of the additional metal plate 7*a*, to which the surface of the additional highly-heat-dissipating insulation adhesive sheet 6*a* is thermally connected. Consequently, it is possible to easily manufacture a power module 200 in which further increase of heat dissipation is realized.

Since the manufacturing method for the power semiconductor device 101 according to the fourth embodiment includes the step of thermally connecting the cooler 9 via the metal joining body 8 to the surface of the metal plate 7 that is exposed from the sealing resin member 5, and thermally connecting the cooler 9*b* via the metal joining body 8*a* to the surface of the additional metal plate 7*a* that is exposed from the sealing resin member 5, it is possible to easily manufacture a power semiconductor device 101 in which heat generated from each of the semiconductor elements 1a and 1b inside the power module 201 can be efficiently dissipated from the coolers 9 and 9b to outside.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the technical scope of the specification of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 semiconductor element
2a first lead frame
2b second lead frame
2c third lead frame
2d fourth lead frame
3 heat spreader
3a step
3b additional heat spreader
4 joining body
5 sealing resin member
6 highly-heat-dissipating insulation adhesive sheet
6a additional highly-heat-dissipating insulation adhesive sheet
7 metal plate
7a additional metal plate
8 metal joining body
8a metal joining body
9 cooler
9a heat dissipation fin
9b cooler
10 metal spacer
20 metal circuit board
100 power semiconductor device
101 power semiconductor device
170 power module intermediate
180 power module intermediate
190 power module intermediate
200 power module
201 power module

What is claimed is:

1. A power module comprising:
   a heat spreader having a plate shape and having heat conducting property;
   a semiconductor element at least thermally connected to a one-side surface of the heat spreader;
   a highly-heat-dissipating insulation adhesive sheet having a plate shape and having a one-side surface thermally connected to an other-side surface of the heat spreader;
   a metal plate having a one-side surface thermally connected to an other-side surface of the highly-heat-dissipating insulation adhesive sheet; and
   a sealing resin member sealing the semiconductor element, the heat spreader, the highly-heat-dissipating insulation adhesive sheet, and the metal plate in a state where an other-side surface of the metal plate is exposed, and
   wherein as seen in a direction perpendicular to the one-side surface of the heat spreader, an outer periphery portion of the surface, of the heat spreader, that is in contact with the highly-heat-dissipating insulation adhesive sheet has at least one step which is formed so as to be recessed from the outer periphery portion toward an inner portion of the heat spreader.

2. The power module according to claim 1, wherein as seen in a direction perpendicular to the one-side surface of the metal plate, an outer periphery portion of the highly-heat-dissipating insulation adhesive sheet is located inward of an outer periphery portion of the metal plate.

3. The power module according to claim 1, wherein the highly-heat-dissipating insulation adhesive sheet and the heat spreader are in contact with each other, and the highly-heat-dissipating insulation adhesive sheet and the metal plate are in contact with each other.

4. The power module according to claim 1, wherein the semiconductor element is formed from a semiconductor material having a wide bandgap.

5. The power module according to claim 1, further comprising:
   an additional heat spreader which has a plate shape and has heat conducting property and to which a surface of the semiconductor element that is on an opposite side to the heat spreader is thermally connected;
   an additional highly-heat-dissipating insulation adhesive sheet which has a plate shape and has heat conducting property and to which a surface of the additional heat spreader that is on an opposite side to the semiconductor element is thermally connected; and
   an additional metal plate to which a surface of the additional highly-heat-dissipating insulation adhesive sheet that is on an opposite side to the additional heat spreader is thermally connected, wherein
   the sealing resin member seals the additional heat spreader, the additional highly-heat-dissipating insulation adhesive sheet, and the additional metal plate in a state where a surface of the additional metal plate that is on an opposite side to the additional highly-heat-dissipating insulation adhesive sheet is exposed.

6. A power semiconductor device comprising:
   the power module according to claim 1; and
   a cooler thermally connected via a metal joining body to the surface of the metal plate that is exposed from the sealing resin member.

7. The power module according to claim 1,
   wherein the at least one step of the heat spreader is at least partly facing towards the highly-heat-dissipating insulation adhesive sheet.

8. The power module according to claim 1,
   wherein the at least one step of the heat spreader is a gap between an inner portion of the heat spreader and a portion of the heat spreader in contact with the highly-heat-dissipating insulation adhesive sheet, and
   wherein the inner portion is facing the highly-heat-dissipating insulation adhesive sheet.

9. The power module according to claim 1,
   wherein a first end of the at least one step of the heat spreader is in direct contact with the highly-heat-dissipating insulation adhesive sheet, and wherein a second end of the at least one step of the heat spreader is separated from the highly-heat-dissipating insulation adhesive sheet, and as seen in a direction perpendicular to the one-side surface of the metal plate, the first end is located more inward of an outer periphery portion of the metal plate than is the second end.

10. The power module according to claim 9, wherein the second end is cantilevered away from the first end and the highly-heat-dissipating insulation adhesive sheet.

* * * * *